US010986728B2

(12) United States Patent
Xu et al.

(10) Patent No.: US 10,986,728 B2
(45) Date of Patent: Apr. 20, 2021

(54) MULTILAYER BOARD

(71) Applicant: Murata Manufacturing Co., Ltd., Nagaokakyo (JP)

(72) Inventors: Chu Xu, Nagaokakyo (JP); Takahiro Baba, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 41 days.

(21) Appl. No.: 16/532,521

(22) Filed: Aug. 6, 2019

(65) Prior Publication Data

US 2019/0363417 A1 Nov. 28, 2019

Related U.S. Application Data

(63) Continuation of application No. PCT/JP2018/003800, filed on Feb. 5, 2018.

(30) Foreign Application Priority Data

Feb. 16, 2017 (JP) .............................. JP2017-027026

(51) Int. Cl.
*H05K 1/02* (2006.01)
*H01P 3/08* (2006.01)
*H01P 3/02* (2006.01)

(52) U.S. Cl.
CPC ........... *H05K 1/0298* (2013.01); *H01P 3/026* (2013.01); *H01P 3/088* (2013.01); *H05K 1/025* (2013.01);
(Continued)

(58) Field of Classification Search
CPC ....... H01P 3/026; H01P 3/088; H05K 1/0215; H05K 1/0298; H05K 3/361; H05K 1/0251;
(Continued)

(56) References Cited

U.S. PATENT DOCUMENTS

2015/0318595 A1 11/2015 Yosui et al.
2015/0340751 A1 11/2015 Watanabe et al.
(Continued)

FOREIGN PATENT DOCUMENTS

JP 2006-24618 A 1/2006
JP 2006-351647 A 12/2006
(Continued)

OTHER PUBLICATIONS

Machine English Translation of JP2006351647A, Published on Dec. 28, 2006 (Year: 2006).*
(Continued)

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

A multilayer board includes a laminated insulating body, signal conductors inside the laminated insulating body and extending in a transmission direction, and ground conductors sandwiching each of the signal conductors in a lamination direction via the insulating base material layers. The multilayer board includes a parallel extending portion in which the signal conductors extend parallel and that includes signal conductors arranged separately from each other in a direction orthogonal to the transmission direction in a planar view in the lamination direction, and a signal conductor overlapping with the signal conductor in a planar view in the lamination direction and arranged separately from the signal conductor in the lamination direction. The parallel extending portion includes first and second regions arranged separately in a direction orthogonal to the transmission direction in a planar view in the lamination direction.

15 Claims, 12 Drawing Sheets

(52) U.S. Cl.
CPC ......... *H05K 1/0215* (2013.01); *H05K 1/0243* (2013.01)

(58) Field of Classification Search
CPC ...... H05K 1/189; H05K 1/025; H05K 1/0243; H05K 3/4644
USPC ........................ 333/1, 5, 238, 245, 246, 247
See application file for complete search history.

(56) References Cited

U.S. PATENT DOCUMENTS

| | | |
|---|---|---|
| 2017/0187087 A1 | 6/2017 | Baba et al. |
| 2019/0088388 A1 | 3/2019 | Baba et al. |

FOREIGN PATENT DOCUMENTS

| | | |
|---|---|---|
| JP | 2014/115607 A1 | 7/2014 |
| JP | 5690429 B1 | 3/2015 |
| WO | 2016/047540 A1 | 3/2016 |
| WO | 2017/199930 A1 | 11/2017 |

OTHER PUBLICATIONS

Official Communication issued in International Patent Application No. PCT/JP2018/003800, dated Apr. 17, 2018.

* cited by examiner

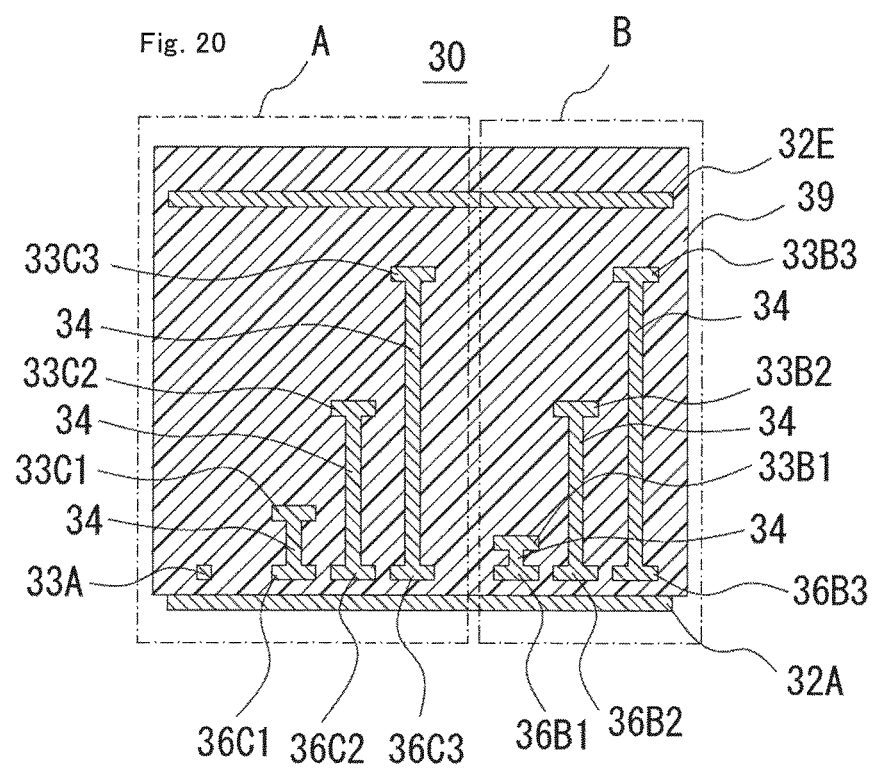

MULTILAYER BOARD

CROSS REFERENCE TO RELATED APPLICATIONS

This application claims the benefit of priority to Japanese Patent Application No. 2017-027026 filed on Feb. 16, 2017 and is a Continuation Application of PCT Application No. PCT/JP2018/003800 filed on Feb. 5, 2018. The entire contents of each application are hereby incorporated herein by reference.

BACKGROUND OF THE INVENTION

1. Field of the Invention

The present disclosure relates to a multilayer board.

2. Description of the Related Art

A flat cable including multiple signal lines arranged in a width direction is attracting attention as a transmission line transmitting a high frequency signal in an electronic device. For example, WO 2014/115607 describes a transmission line including a flat dielectric element body, a signal conductor built into the dielectric element body and extending along a transmission direction, a reference ground conductor, an auxiliary ground conductor, and a thickness-direction connecting conductor, and it is described that the transmission line enables transmission with high isolation ensured between multiple high frequency signals and can be formed compact and thin.

SUMMARY OF THE INVENTION

Preferred embodiments of the present invention provide multilayer boards each including a laminated insulating body including a plurality of insulating base material layers that are laminated; three or more signal conductors provided inside the laminated insulating body and extending in a transmission direction of a signal along the insulating base material layers; and a plurality of ground conductors sandwiching each of the signal conductors in a lamination direction via the insulating base material layers. The multilayer board includes a parallel extending portion in which the signal conductors extend parallel or substantially parallel to transmit a high frequency signal. The parallel extending portion includes two or more signal conductors arranged separately from each other in a direction orthogonal or substantially orthogonal to the transmission direction in a planar view in the lamination direction, and a signal conductor including an overlap with the signal conductor in a planar view in the lamination direction and arranged separately from the signal conductor in the lamination direction. The parallel extending portion includes a first region and at least one second region respectively including the signal conductors arranged separately from each other in a direction orthogonal or substantially orthogonal to the transmission direction in a planar view in the lamination direction. The first region includes a larger number of overlapping signal conductors in the lamination direction than the second region. The first region includes a portion in which an interval between the ground conductors sandwiching the signal conductor is smaller than a minimum value of an interval between the ground conductors sandwiching the signal conductor in the second region.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 20 is an exemplary cross-sectional view in an end portion of the parallel extending portion of the multilayer board according to the third preferred embodiment of the present invention.

DETAILED DESCRIPTION OF THE PREFERRED EMBODIMENTS

Figure 1A:
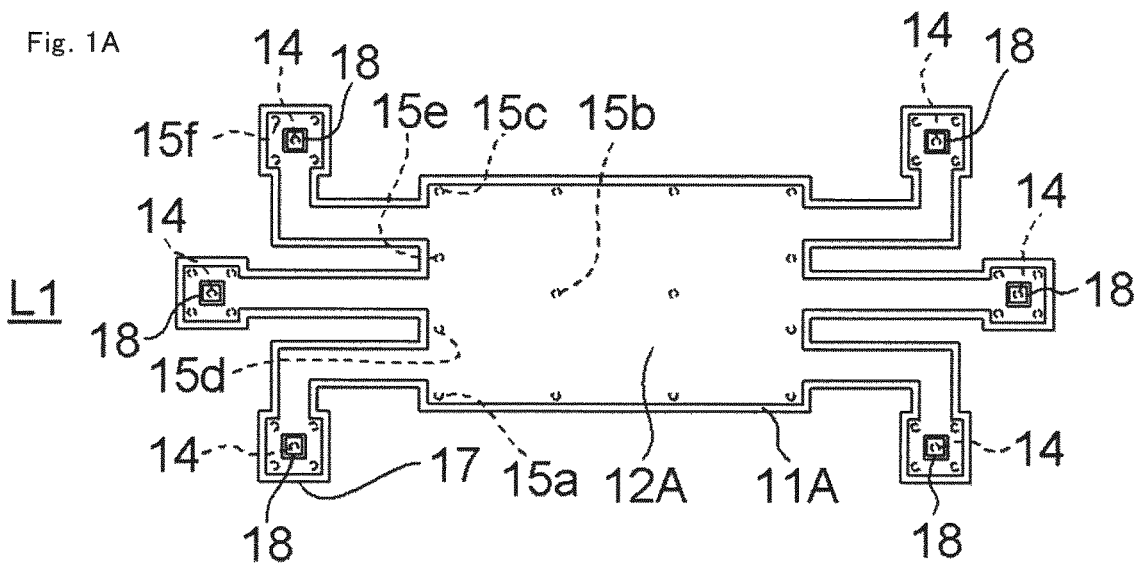
FIG. 1A is a plan view of a layer L1 of a multilayer board according to a first preferred embodiment of the present invention.

A low-loss transmission line including more signal lines is required due to downsizing of electronic devices in which the transmission line is used. However, if a large number of signal transmission portions including signal conductors each sandwiched by ground conductors are arranged in the width direction of the transmission line, the transmission lines are increased in width, which may make it difficult to sufficiently meet a requirement for miniaturization. According to preferred embodiments of the present disclosure, multilayer boards which are each usable as a transmission line including multiple signal transmission portions and capable of reducing a length in the width direction are able to be provided.

A multilayer board according to a first preferred embodiment includes a laminated insulating body including a plurality of insulating base material layers that are laminated; three or more signal conductors provided inside the laminated insulating body and extending in a transmission direction of a signal along the insulating base material layers; and a plurality of ground conductors sandwiching each of the signal conductors in a lamination direction via the insulating base material layers. The multilayer board includes a parallel extending portion in which the signal conductors extend parallel or substantially parallel to transmit a high frequency signal. The parallel extending portion includes two or more signal conductors arranged separately from each other in a direction orthogonal or substantially orthogonal to the transmission direction in a planar view in the lamination direction, and a signal conductor including an overlap with the signal conductor in a planar view in the lamination direction and arranged separately from the signal conductor in the lamination direction. The parallel extending portion includes a first region and at least one second region respectively including the signal conductors arranged separately from each other in a direction orthogonal or substantially orthogonal to the transmission direction in a planar view in the lamination direction. The first region includes a larger number of the signal conductors arranged to overlap in the lamination direction than the second region, and the first region includes a portion in which an interval between the ground conductors sandwiching the signal conductor is smaller than a minimum value of an interval between the ground conductors sandwiching the signal conductor in the second region.

Since the first region includes a larger number of the signal conductors than the second region and the signal conductors are arranged such that the first region includes a portion in which an interval between the ground conductors sandwiching the signal conductor is smaller than a minimum value of an interval between the ground conductors sandwiching the signal conductor in the second region, the length in the width direction of the multilayer board orthogonal or substantially orthogonal to the lamination direction and the transmission direction are able to be reduced while reducing or preventing crosstalk between the signal conductor included in the first region and the signal conductor included in the second region.

The second region may include a signal conductor that is wider than the signal conductor included in the first region. When the second region includes a wider signal conductor, even when the ground conductor interval in the second region is wide, impedance is able to be easily matched between signal transmission portions, and a transmission loss of the signal transmission portions is able to be reduced.

The parallel extending portion may include a curved portion in which the transmission direction is bent along a plane orthogonal or substantially orthogonal to the lamination direction, and the first region may be disposed at a position on the inner side relative to the second region in the curved portion. When the first region is disposed in a portion on the inner side of the curved portion, the line lengths of more signal conductors are able to be shortened, and the transmission loss of the entire transmission line is able to be reduced.

Lead-out conductors respectively connected to the signal conductors and led out toward a mounting surface in the lamination direction may be provided at an end portion in the transmission direction, and the signal conductors that overlap in the lamination direction may be structured such that a total length of the lead-out conductors is shorter as compared to when the signal conductors are disposed at equal or substantially equal intervals in the lamination direction. Providing more signal conductors on the mounting surface side further reduces the transmission loss due to the lead-out conductors in the lamination direction connected to the signal conductors.

The multilayer board may preferably further include at least one interlayer connection conductor connecting the ground conductors in the lamination direction, between the signal conductor included in the first region and the signal conductor included in the second region. This improves isolation between the signal conductor included in the first region and the signal conductor included in the second region, so that crosstalk between the signal conductors is reduced or prevented. A plurality of interlayer connection conductors may be provided along the transmission direction. The interlayer connection conductor may be made of a conductive paste disposed through the insulating base material layer or may be defined by a through hole disposed in the multilayer board.

The multilayer board may preferably further include at least one interlayer connection conductor connecting the ground conductors in the lamination direction, in an outer edge portion of the parallel extending portion. This reduces or prevents unnecessary radiation from the signal conductors to the outside. A plurality of interlayer connection conductors may be provided along the transmission direction.

The multilayer board may preferably further include an auxiliary ground conductor disposed along the transmission direction and connected to the ground conductor, between the signal conductor included in the first region and the signal conductor included in the second region. This improves isolation between the signal conductor included in the first region and the signal conductor included in the second region, so that crosstalk between the signal conductors is effectively reduced or prevented. The auxiliary ground conductor is connected to the ground conductor by the interlayer connection conductor, for example. The auxiliary ground conductor may preferably be a flat plate-shaped conductor, for example. The auxiliary ground conductor may be defined by a continuous flat plate-shaped conductor extending along the transmission direction or may be defined by a plurality of flat plate-shaped conductors separated from each other along the transmission direction. The auxiliary ground conductor may be disposed in the same or substantially the same layer as the signal conductor in the lamination direction or may be disposed in a layer different from the signal conductor. When the auxiliary ground conductor is disposed in a layer different from the signal conductor in the lamination direction, a plurality of auxiliary ground conductors may be disposed in upper and lower layers sandwiching the layer in which the signal conductor is disposed, for example.

The multilayer board may preferably further include an auxiliary ground conductor disposed along the transmission direction and connected to the ground conductor, in the outer edge portion of the parallel extending portion. This reduces or prevents unnecessary radiation from the signal conductors to the outside. The auxiliary ground conductor is preferably, for example, connected to the ground conductor by the interlayer connection conductor. The auxiliary ground conductor is preferably connected to the ground conductor by the interlayer connection conductor, for example. The auxiliary ground conductor may preferably be a flat plate-shaped conductor, for example. The auxiliary ground conductor may be defined by a continuous flat plate-shaped conductor extending along the transmission direction or may be defined by a plurality of flat plate-shaped conductors separated from each other along the transmission direction. The auxiliary ground conductor may be disposed in the same or substantially the same layer as the signal conductor in the lamination direction or may be disposed in a layer different from the signal conductor. When the auxiliary ground conductor is disposed in a layer different from the signal conductor in the lamination direction, a plurality of auxiliary ground conductors may be disposed in upper and lower layers sandwiching the layer in which the signal conductor is disposed, for example.

Preferred embodiments of the present invention will now be described with reference to the drawings. It is noted that the preferred embodiments described below are examples of multilayer boards to describe the technical ideas and advantages of the present invention, and the present invention is not limited to the multilayer boards described below. The members described in claims are not limited to the members of the preferred embodiments in any way. Particularly, the dimensions, materials, shapes, relative arrangements, and structures of the elements and portions described in the preferred embodiments are merely illustrative examples and are not intended to limit the scope of the present invention only thereto unless otherwise specified. In the drawings, the same or similar portions are denoted by the same reference numerals. Although the preferred embodiments are separately described for convenience to facilitate explanation and/or understanding of main points, configurations described in different preferred embodiments may be partially replaced or combined. In second and subsequent preferred embodiments, matters common to the first preferred embodiment will not be described, and only the differences will be described. Particularly, the same advantageous effects according to the same or similar configuration will not be described in each preferred embodiment.

First Preferred Embodiment

FIGS. 1A to 1E are plan views of respective layers L1 to L5 of a multilayer board according to a first preferred embodiment as viewed from the side of a surface defining and functioning as a mounting surface. The layer L1 is on the mounting surface side, and the layers L1 to L5 are laminated in this order to provide the multilayer board. Each of the layers L1 to L5 includes a region corresponding to a parallel extending portion disposed with a ground conductor and/or a signal conductor, and a region corresponding to a lead-out portion extending from the region corresponding to the parallel extending portion to a connection terminal portion 17.

In the layer L1 of FIG. 1A, a ground conductor 12A is provided on an insulating base material layer 11A, and the connection terminal portion 17 is provided with a terminal electrode 18. For example, a connector may be connected to the terminal electrode 18 by using solder, for example, or the terminal electrode 18 may be directly connected to a mounting electrode on a mounting board by solder, for example. The ground conductor 12A disposed in the layer L1 covers the regions corresponding to the parallel extending portion and the lead-out portion and a region of the connection terminal portion 17 excluding a portion around the terminal electrode 18. The terminal conductor 18 is connected to a signal conductor built into the parallel extending portion via a lead-out conductor in the transmission direction of the layer L2 and a first interlayer connection conductor 14. If the connection conductor connecting the terminal electrode 18 and the signal conductor is provided on a side surface of the multilayer board, the connection conductor allowing passage of a signal is exposed, which may adversely affect surrounding devices due to unnecessary radiation. In the multilayer board, the terminal electrode 18 and the signal conductor are connected via the first interlayer connection conductor 14 disposed in the connection terminal portion 17, and the periphery of the first interlayer connection conductor is surrounded by ground conductors and second interlayer connection conductors 15f connecting between the ground conductors. By connecting the signal conductor and the terminal electrode 18 through the first interlayer connection conductor 14 disposed inside the multilayer board in this manner, the unnecessary radiation is able to be reduced or prevented. In this case, the first interlayer connection conductor may preferably have a smaller cross-sectional area than a connection conductor defined by a planar conductor. Furthermore, when the first interlayer connection conductor is defined by a via conductor, for example, the via conductor is preferably made of a material that is reactive with and capable of being joined to a planar conductor disposed on the insulating base material layer. For example, if the planar conductor is made of copper, the via conductor is preferably made of a copper-tin-based material having a larger conductor loss than copper. From the above, the first interlayer connection conductor with a short line length is preferably provided. In the layer L1, the ground conductor 12A does not cover an end surface portion of the insulating base material layer 11A. Therefore, when the multilayer board is made, the ground conductor 12A is not exposed on the side surface of the multilayer board and is built into a laminated insulating body.

Figure 1B:
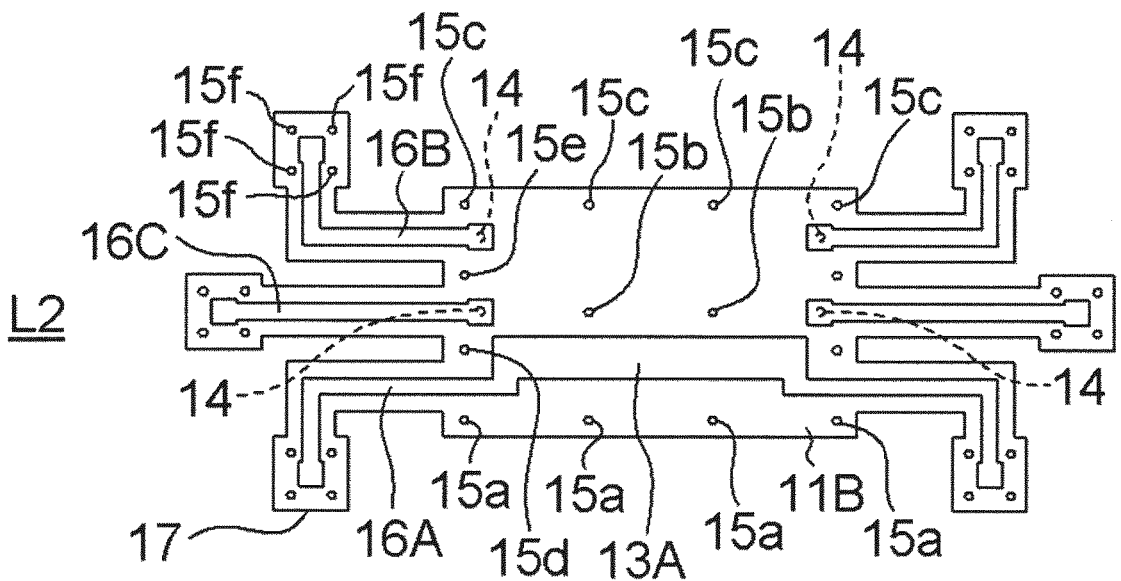
FIG. 1B is a plan view of a layer L2 of the multilayer board according to the first preferred embodiment of the present invention.

The layer L2 of FIG. 1B includes a signal conductor 13A disposed on the region corresponding to the parallel extending portion of an insulating base material layer 11B and lead-out conductors 16A to 16C in the transmission direction disposed on the region corresponding to the lead-out portion. One end portion of each of the lead-out conductors 16A to 16C in the transmission direction is connected to the terminal electrode 18 via the first interlayer connection conductor 14 disposed in the layer L1 through the insulating base material layer 11A. The lead-out conductor 16A is integrally provided with the signal conductor 13A. The other end portion of each of the lead-out conductors 16B, 16C is provided with a connection portion for a signal conductor 13B or 13C, and the first interlayer connection conductor 14 penetrating the insulating base material layer 11B is connected to the connection portion.

The region corresponding to the parallel extending portion of insulating base material layer 11B includes second interlayer connection conductors 15a, 15b, and 15d penetrating the insulating base material layer 11B and connecting the ground conductors of the layers L1, L3 to each other. A plurality of the second interlayer connection conductors 15a are provided along the transmission direction in an outer edge portion of the region corresponding to the parallel extending portion. A plurality of the second interlayer connection conductors 15b are provided along the transmission direction between the signal conductor 13A in the region corresponding to the parallel extending portion and a region corresponding to the signal conductor 13B. The second interlayer connection conductors 15d are provided at both end portions in the transmission direction of the region corresponding to the parallel extending portion. The isolation of the signal conductor 13A is able to be improved by arranging the second interlayer connection conductors 15a, 15b, and 15d to surround the signal conductor 13A. A plurality of second interlayer connection conductors 15c are provided along the transmission direction in an outer edge portion of the region corresponding to the parallel extending portion, and second interlayer connection conductors 15e are also provided at both end portions in the transmission direction of the region corresponding to the parallel extending portion, so that the ground conductor 12A of the layer L1 and a ground conductor 12C of the layer L5 are connected via the second interlayer connection conductors 15c or 15e disposed in the layer L3 and the layer L4. Since the ground conductors are connected through a plurality of the second interlayer connection conductors 15a to 15e, a ground state of the multilayer board is more stabilized, and the isolation of the signal conductor is improved.

The second interlayer connection conductors 15f are provided in an outer circumferential portion of the connection terminal portion 17 of the layer L2 and surrounds one end portion of each of the lead-out conductors 16A to 16C in the transmission direction. The second interlayer connection conductors 15f connect the ground conductor 12A of the layer L1 and the ground conductor 12C of the layer L5 via the second interlayer connection conductors 15f provided in the layer L3 and the layer L4. Since the one end portion of each of the lead-out conductors 16A to 16C in the transmission direction is surrounded by the second interlayer connection conductors 15f connected to the ground conductors 12A and 12C, unnecessary radiation from the first interlayer connection conductor 14 connected to the terminal electrode 18 is reduced or prevented. The other end portions of the lead-out conductors 16B and 16C in the transmission direction are interposed between the second interlayer connection conductors 15c, 15d, and 15e connected to the ground conductors 12A and 12C. This reduces or prevents unnecessary radiation from the first interlayer connection conductor 14 connecting the signal conductor 13B and the lead-out conductor 16B as well as the first interlayer connection conductor 14 connecting the signal conductor 13C and the lead-out conductor 16C.

Figure 1C:
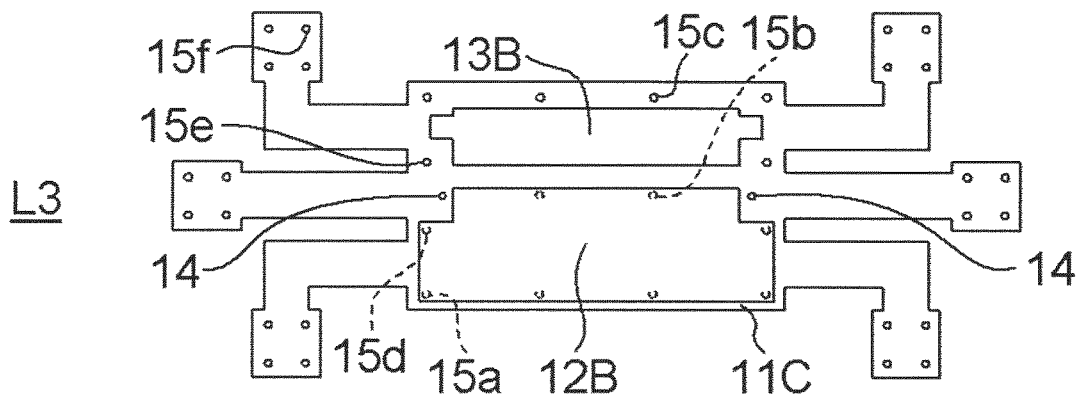
FIG. 1C is a plan view of a layer L3 of the multilayer board according to the first preferred embodiment of the present invention.

In the layer L3 of FIG. 1C, the signal conductor 13B is provided at a position not overlapping in the lamination direction with the signal conductor 13A of the layer L2 on the region corresponding to the parallel extending portion of an insulating base material layer 11C, and a ground conductor 12B is provided at a position overlapping in the lamination direction with the signal conductor 13A of the layer L2. The signal conductor 13B is connected to the lead-out conductor 16B via the first interlayer connection conductor 14 provided through the insulating base material layer 11B in the other end portion of the lead-out conductor 16B of the layer L2. As with the layer L2, a plurality of the second interlayer connection conductors 15a to 15f connecting between the ground conductors are provided through the insulating base material layer 11C.

Figure 1D:
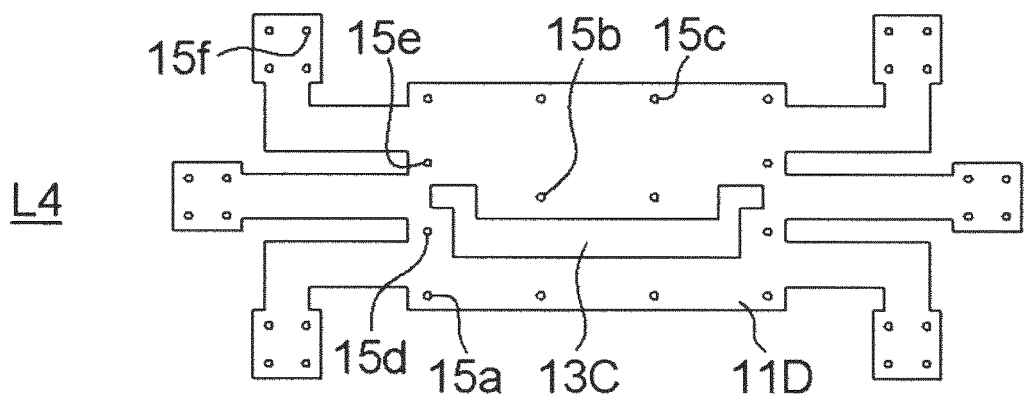
FIG. 1D is a plan view of a layer L4 of the multilayer board according to the first preferred embodiment of the present invention.

In the layer L4 of FIG. 1D, the signal conductor 13C is provided at a position corresponding to the signal conductor 13A on the region corresponding to the parallel extending portion of an insulating base material layer 11D. An end portion of the signal conductor 13C is connected to the lead-out conductor 16C via the first interlayer connection conductor 14 provided through the insulating base material layer 11C in the layer L3 and the first interlayer connection conductor 14 provided through the insulating base material layer 11B in the other end portion of the lead-out conductor 16C of the layer L2. As with the layers L2 and L3, the plurality of the second interlayer connection conductors 15a to 15f connecting the ground conductors are provided through the insulating base material layer 11D.

Figure 1E:
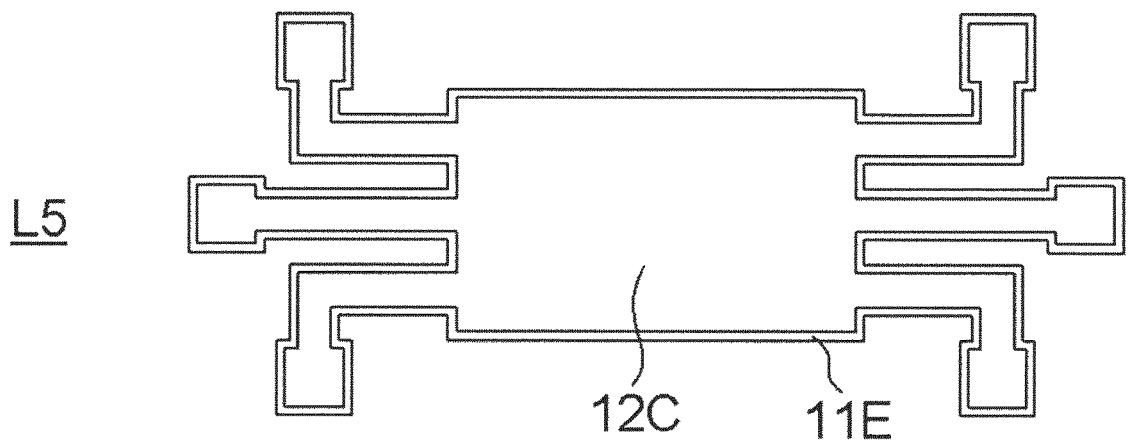
FIG. 1E is a plan view of a layer L5 of the multilayer board according to the first preferred embodiment of the present invention.

In the layer L5 of FIG. 1E, the ground conductor 12C is provided on an insulating base material layer 11E, covering the regions corresponding to the parallel extending portion and the lead-out portion as well as the connection terminal portion 17. The ground conductor 12C is connected to the ground conductor 12A of the layer L1 via the second interlayer connection conductors 15a to 15f provided in each of the layers L2 to L4.

The insulating base material layers 11A to 11E are preferably made of a thermoplastic resin, such as a liquid crystal polymer (LCP), for example. The ground conductors 12A to 12C, the signal conductor 13A, the signal conductor 13B, and the signal conductor 13C are preferably made by, for example, a patterning process of a copper foil into a desired shape on a single-sided copper-clad base material including the copper foil affixed to one entire or substantially one entire surface of an insulating base material layer. The first interlayer connection conductor 14 and the second interlayer connection conductors 15a to 15f may penetrate the insulating base material layer in the thickness direction by, for example, forming a through-hole by a method such as irradiation with a laser beam from the surface of the single-sided copper-clad base material not covered with the copper foil, filling the through-hole with a conductive paste, and solidifying the paste by heating.

Figure 2:
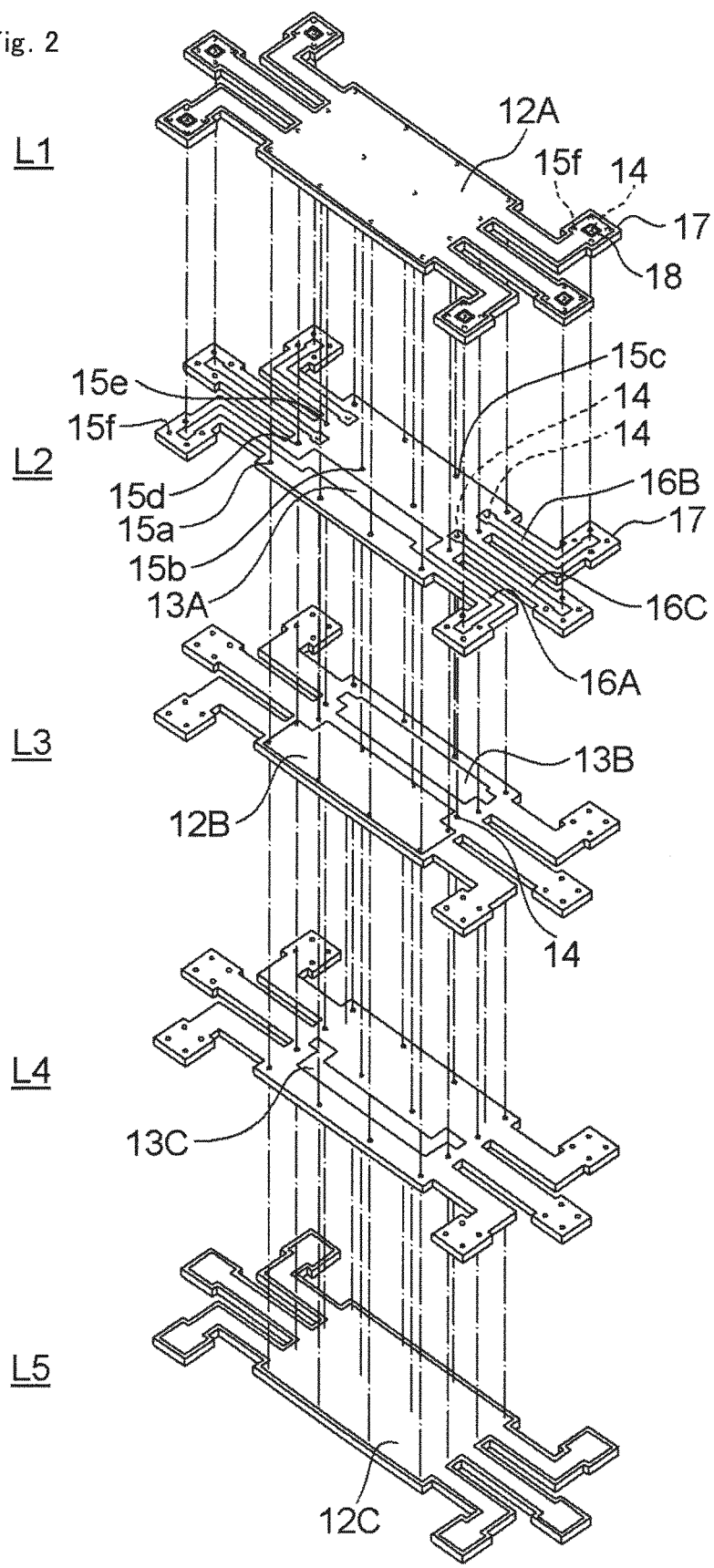
FIG. 2 is an exploded perspective view showing a structure of the multilayer board according to the first preferred embodiment of the present invention.

FIG. 2 is an exploded perspective view showing a state of connection between the layers through the first and second interlayer connection conductors in the multilayer board according to the first preferred embodiment as viewed from the side of the surface defining and functioning as the mounting surface. As shown in FIG. 2, the layers L1 to L5 are laminated such that the corresponding first interlayer connection conductors in the layers are connected to each other and that the corresponding second interlayer connection conductors in the layers are connected to each other, and are heated and pressurized in a lamination direction by a heating press, for example, to provide the multilayer board including a laminated insulating body integrated with the conductors. In FIG. 2, the ground conductors 12A, 12B, and 12C are interconnected via the plurality of the second interlayer connection conductors 15a to 15e provided in the layers. To the terminal electrode 18 disposed in the connection terminal portion of the layer L1, one end portion of each of the lead-out conductors 16A, 16B, and 16C provided in the connection terminal portion 17 of the layer L2 is connected via the first interlayer connection conductor 14. To the other end portion of the lead-out conductor 16B of the layer L2, the end portion of the signal conductor 13B of the layer L3 is connected via the first interlayer connection conductor 14 provided in the layer L2. To the other end portion of the lead-out conductor 16C of the layer L2, the end portion of the signal conductor 13C of the layer L4 is connected via the first interlayer connection conductor 14 provided in the layer L2 and the first interlayer connection conductor 14 provided in the layer L3. In FIG. 2, the state of connection of the second interlayer connection conductors 15$f$ in the connection terminal portion 17 is not shown. Although the ground conductor 12A is exposed on the mounting surface side in FIG. 2, a resist covering the ground conductor 12A may preferably be further provided. When the multilayer board includes a resist, the ground conductor 12A is protected from an external environment, and unnecessary connection to the mounting board is reduced or prevented. The resist preferably includes an insulating resin, for example.

Figure 3:
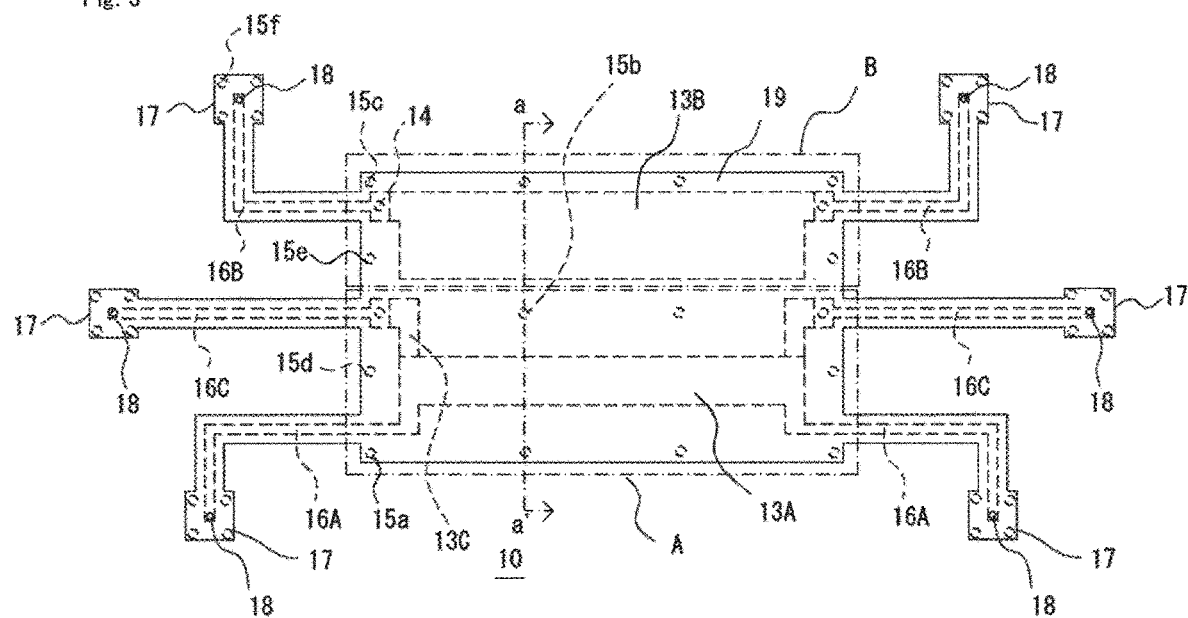
FIG. 3 is a transparent plan view of the multilayer board according to the first preferred embodiment of the present invention.

FIG. 3 is a transparent plan view of a multilayer board 10 according to the first preferred embodiment as viewed from the mounting surface side. In FIG. 3, for simplicity, the ground conductors are not shown. The multilayer board 10 includes a laminated insulating body 19 including the insulating base material layers that are laminated, and the laminated insulating body 19 includes a parallel extending portion in which the signal conductors 13A, 13B, and 13C are provided, and a lead-out portion including each of the lead-out conductors 16A, 16B and 16C built therein and extending from the parallel extending portion to the connection terminal portion 17. In the parallel extending portion, the signal conductors 13A, 13B, and 13C each extend in the signal transmission direction. The signal conductors 13A and 13B are disposed separately from each other in the width direction of the parallel extending portion orthogonal or substantially orthogonal to the signal transmission direction as viewed in the lamination direction. The signal conductor 13C overlaps with the signal conductor 13A in the lamination direction as viewed in the lamination direction and is disposed separately from the signal conductor 13A in the lamination direction. In FIG. 3, a large portion of the signal conductor 13C is hidden behind the signal conductor 13A. In the parallel extending portion, a first region A including the signal conductors 13A and 13C and a second region B including the signal conductor 13B are spaced apart from each other in the width direction of the parallel extending portion along the transmission direction.

The signal conductor 13A is integrated with the lead-out conductor 16A in the transmission direction on the same surface of the insulating base material layer. The signal conductor 13B is connected at each of the end portions in the transmission direction via the first interlayer connection conductor 14 to the end portion of the lead-out conductor 16B in the parallel extending portion. The signal conductor 13C includes a lead-out portion in the width direction of the parallel extending portion at each end portion in the transmission direction and is connected via the first interlayer connection conductor 14 in the parallel extending portion to the end portion of the lead-out conductor 16C in the lead-out portion. The end portion of each of the lead-out conductors 16A, 16B and 16C in the connection terminal portion 17 is connected to the terminal electrode 18 via the first interlayer connection conductor 14 (not shown). The ground conductors 12A, 12B, and 12C not shown are interconnected via the second interlayer connection conductors 15$a$ to 15$f$, and the second interlayer connection conductors 15$a$ to 15$f$ provided in each of the layers are respectively connected in the lamination direction to the second interlayer connection conductors 15$a$ to 15$f$ disposed at corresponding positions in adjacent layers. The plurality of the second interlayer connection conductors 15$a$ to 15$f$ interconnecting the ground conductors 12A, 12B, and 12C are provided in the outer edge portion of the parallel extending portion, between the signal conductors 13A and 13B, and in the outer circumferential portion of the connection terminal portion 17, so that the ground state of the multilayer board used as a high frequency signal transmission path is stabilized.

In the multilayer board 10, the plurality of the second interlayer connection conductors 15$a$ interconnecting the ground conductors 12A, 12B, and 12C is provided along the transmission direction in the outer edge portion of the first region A of the parallel extending portion. Although the four second interlayer connection conductors 15$a$ are provided in FIG. 3, five or more interlayer connection conductors may be provided. In the multilayer board 10, the plurality of the second interlayer connection conductors 15$c$ interconnecting the ground conductors 12A, 12B, and 12C is provided along the transmission direction in the outer edge portion of the second region B of the parallel extending portion. Although the four second interlayer connection conductors 15$c$ are provided in FIG. 3, five or more interlayer connection conductors may be provided. In the multilayer board 10, the second interlayer connection conductors 15$d$ interconnecting the ground conductors 12A, 12B, and 12C and the second interlayer connection conductors 15$e$ interconnecting the ground conductors 12A and 12C are provided at both end portions in the transmission direction of the parallel extending portion. Since the signal conductor 13A is surrounded by the ground conductors 12A and 12B as well as the second interlayer connection conductors 15$a$ and 15$b$, the isolation of the signal conductor 13A is able to be further improved. Additionally, since the signal conductor 13B is surrounded by the ground conductors 12A and 12C as well as the second interlayer connection conductors 15$b$ and 15$c$, the isolation of the signal conductor 13B is able to be improved. Furthermore, since the signal conductor 13C is surrounded by the ground conductors 12B and 12C as well as the second interlayer connection conductors 15$a$ and 15$b$, the isolation of the signal conductor 13C is able to be improved.

The second interlayer connection conductors 15$f$ are provided in the outer circumferential portion of the connection terminal portion 17 of the multilayer board 10 and surround the terminal electrode 18 and one end portion of each of the lead-out conductors 16A to 16C in the transmission direction. The second interlayer connection conductors 15$f$ connect the ground conductor 12A and the ground conductor 12C in the lamination direction. Since the one end portion of each of the lead-out conductors 16A to 16C in the transmission direction is surrounded by the second interlayer connection conductors 15$f$ connected to the ground conductors 12A and 12C, the unnecessary radiation from the first interlayer connection conductor 14 connected to the terminal electrode 18 is reduced or prevented. Additionally, the other end portions of the lead-out conductors 16B and 16C in the transmission direction are interposed between the second interlayer connection conductors 15$c$, 15$d$, and 15$e$ connected to the ground conductors 12A and 12C. This reduces or prevents the unnecessary radiation from the first interlayer connection conductor 14 connecting the signal conductor 13B and the lead-out conductor 16B as well as the first interlayer connection conductor 14 connecting the signal conductor 13C and the lead-out conductor 16C.

In the multilayer board 10, the plurality of the second interlayer connection conductors 15b interconnecting the ground conductors 12A, 12B, and 12C are provided along the transmission direction between the signal conductors 13A, 13C and the signal conductor 13B. Although the two second interlayer connection conductors 15b are provided in FIG. 3, three or more second interlayer connection conductors 15b may be provided along the transmission direction. The plurality of the second interlayer connection conductors 15b may preferably be provided in a direction orthogonal or substantially orthogonal to the transmission direction between the signal conductors 13A, 13C and the signal conductor 13B. This further improves both the isolation between the signal conductor 13A and the signal conductor 13B and the isolation between the signal conductor 13C and the signal conductor 13B. In addition to the second interlayer connection conductors 15b, an auxiliary ground conductor (not shown) extending in the transmission direction may preferably be provided between the signal conductors 13A, 13C and the signal conductor 13B. For example, the auxiliary ground conductor is preferably defined by, for example, a flat plate-shaped conductor along the transmission direction. The auxiliary ground conductor may be provided on the layer L2 or L4 in which the signal conductor 13A or 13C is provided or may be provided between the signal conductors 13A and 13C and/or between the signal conductors 13B and 13C in the lamination direction. A plurality of auxiliary ground conductors may preferably be arranged separately from each other along the transmission direction.

Figure 10:
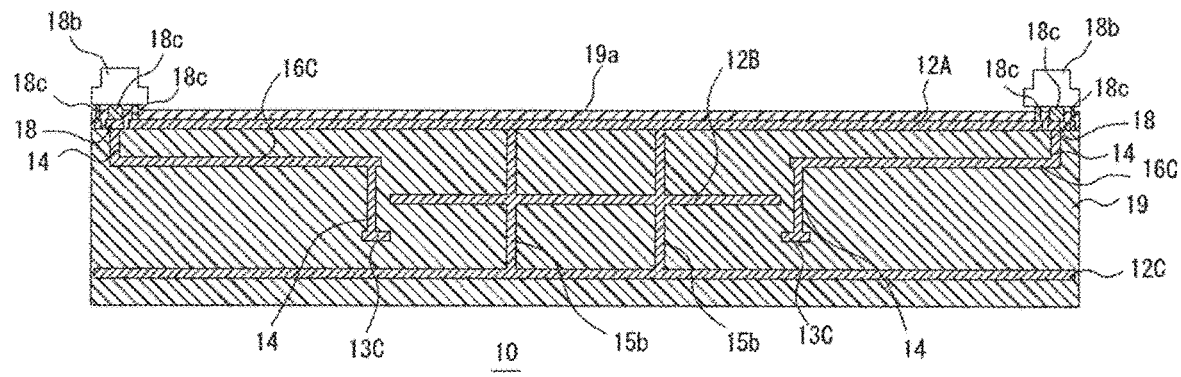
FIG. 10 is another exemplary cross-sectional view of the multilayer board including the resist on the mounting surface.
Figure 11:
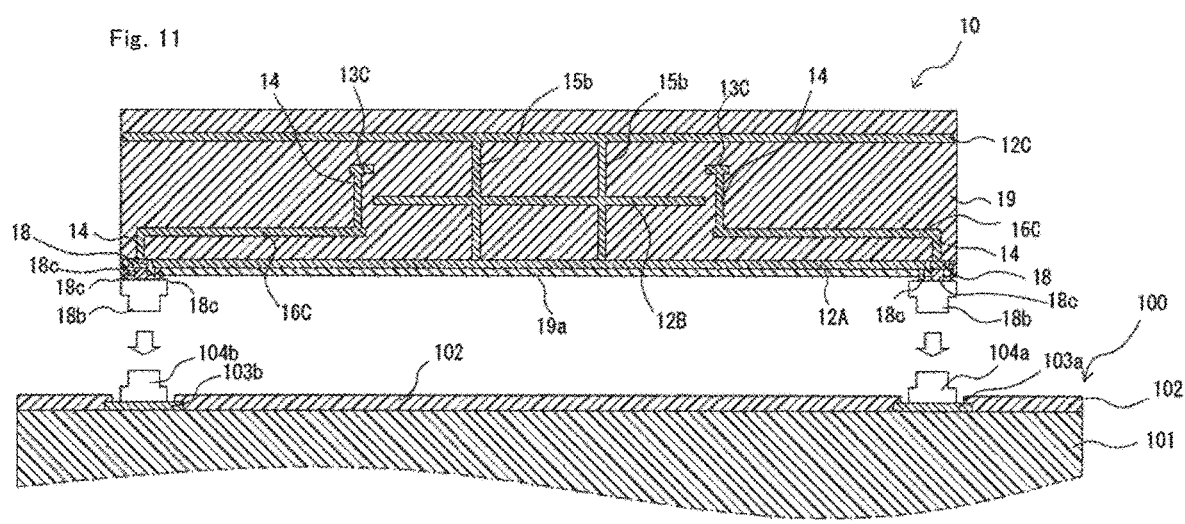
FIG. 11 is a schematic for explaining a mounting method of a multilayer board including a connector on the mounting surface.

In the multilayer board 10, the signal conductors and the lead-out conductors 16A to 16C in the transmission direction built into the lead-out portions are connected at the end portions of the parallel extending portion. The end portion of each of the lead-out conductors 16A to 16C on the connection terminal portion 17 side is connected to the terminal electrode 18 via the first interlayer connection conductor 14. As shown in FIGS. 10 and 11, a connector may be connected to the terminal electrode 18 using a connecting material such as solder, for example, and may be connected to a connector on the mounting board. Alternatively, the terminal electrode 18 may be directly connected to a mounting electrode on the mounting board by a connecting material, such as solder, for example.

Figure 4:
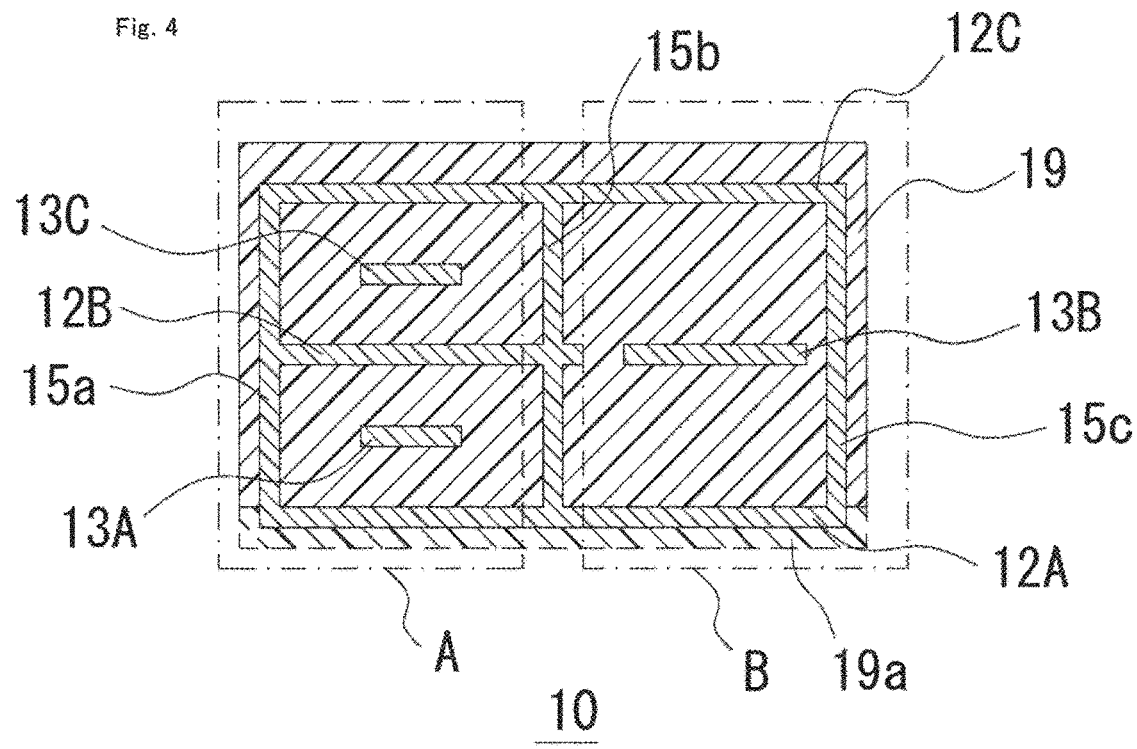
FIG. 4 is an exemplary cross-sectional view in a parallel extending portion of the multilayer board according to the first preferred embodiment of the present invention.

FIG. 4 is a cross-sectional view of the multilayer board 10 showing a cross section of the parallel extending portion taken along a cutting line a-a' of FIG. 3 with the mounting surface facing downward. In FIG. 4, a resist 19a covering the ground conductor 12A is provided on the mounting surface side of the multilayer board. The multilayer board 10 includes, in the order from the side closer to the mounting surface, the signal conductor 13A (hereinafter also referred to as a first signal conductor), the conductor 13B (hereinafter also referred to as a second signal conductor) provided separately from the signal conductor 13A in the width direction of the parallel extending portion as viewed in the lamination direction, and the signal conductor 13C (hereinafter also referred to as a third signal conductor) overlapping with the signal conductor 13A as viewed in the lamination direction and provided separately therefrom in the lamination direction, disposed inside the laminated insulating body 19. In the multilayer board 10, the signal conductors 13A, 13B, and 13C are each sandwiched between two ground conductors via the insulating base material layer. Specifically, the signal conductor 13A is sandwiched between the ground conductors 12A and 12B via the insulating base material layer, the signal conductor 13B is sandwiched between the ground conductors 12A and 12C via the insulating base material layer, and the signal conductor 13C is sandwiched between the ground conductors 12B and 12C via the insulating base material layer. The ground conductors 12B and 12C are built into the laminated insulating body 19. The ground conductor 12A is disposed on the mounting surface side of the laminated insulating body 19 and is covered with the resist 19a.

The parallel extending portion of the multilayer board 10 is sectioned along the transmission direction into the first region A including a larger number of laminated signal conductors that overlap as viewed in the lamination direction and the second region B including a smaller number of laminated signal conductors than the first region A. Although the number of signal conductors arranged separately from each other in the width direction of the parallel extending portion is two in FIG. 4, three or more signal conductors may be arranged separately from each other in the width direction. In this case, the first region A is a region including the largest number of laminated signal conductors that overlap, and the second region B is each of the regions including the signal conductors arranged separately in the width direction from the signal conductors included in the first region A. In FIG. 4, the first signal conductor 13A and the third signal conductor 13C are arranged such that a width of an overlapping portion coincides with the respective line widths as viewed in the lamination direction. However, the signal conductors may be structured such that the width of the overlapping portion is narrower than the line width of any of the signal conductors.

In the multilayer board 10, an interval between the ground conductors 12A and 12B sandwiching the first signal conductor 13A and an interval between the ground conductors 12B and 12C sandwiching the third signal conductor 13C included in the first region A are narrower than an interval between the ground conductors 12A and 12C sandwiching the second signal conductor 13B in the second region B. In the multilayer board 10, if the second region B includes a plurality of second signal conductors 13B that overlap in the lamination direction, the first region A includes a signal conductor sandwiched by ground conductors at an interval narrower than the minimum value of the interval of the ground conductors sandwiching the second signal conductors 13B.

In the multilayer board 10, the line width of the signal conductor 13B included in the second region B is wider than the line width of any of the first signal conductor 13A and the third signal conductor 13B included in the first region A. By providing the wider line width of the signal conductor 13B sandwiched by the ground conductors at a wider interval, impedance is able to be easily matched with a signal transmission portion having a narrow ground conductor interval. The multilayer board 10 used as a transmission line is generally designed with a characteristic impedance of about 50Ω, for example. By making the line width of the second signal conductor 12B wider, the same characteristic impedance of about 50Ω is able to be achieved in a first signal transmission portion including the first signal conductor 13A, the ground conductor 12A, and the ground conductor 12B and a third signal transmission portion including the third signal conductor 13C, the ground conductor 12B, and the ground conductor 12C, as well as a second signal transmission portion including the second signal conductor 13B, the ground conductor 12A, and the ground conductor 12C. A signal passing through the second signal conductor 13B having the larger line width is reduced in conductor loss as compared to a signal passing through the first signal conductor 13A or the third signal conductor 13C. Therefore, for example, if a signal of about 600 MHz to about 900 MHz band or about 2 GHz band, for example, used for cellular phones is assigned to a first signal transmission portion or a third signal transmission portion, for example, a signal of about 5 GHz band used for WiFi is preferably assigned to a signal transmission portion. In other words, it is preferable to assign a signal of a high frequency band, which is more significantly affected by transmission loss, to a second signal transmission portion including the signal conductor with a wider line width. Instead of making the line width of the signal conductor wider, the signal conductor may be made thicker to adjust the characteristic impedance. For example, the second signal conductor 13B may be thicker than the first signal conductor 13A or the third signal conductor 13C to match the impedance. However, a process of manufacturing the multilayer board 10 used as a transmission line may be simplified by making the second signal conductor 13B wider to match the impedance.

In the multilayer board 10, the ground conductors 12A, 12B, and 12C are provided along the transmission direction of the signal conductors. The ground conductors 12A, 12B, and 12C are connected to each other since the second interlayer connection conductors 15a to 15f provided through the insulating base material layer are connected in the lamination direction. In FIG. 4, the ground conductors 12A and 12C are connected to each other via the second interlayer connection conductors 15a and 15c provided in the outer edge portion of the parallel extending portion and the signal interlayer connection conductor 15b provided between the first signal conductor and the third signal conductor. The ground conductor 12B is connected to the ground conductors 12A and 12C via the second interlayer connection conductor 15a provided in the outer edge portion of the parallel extending portion and the second interlayer connection conductor 15b provided between the first signal conductor and the third signal conductor.

Figure 5:
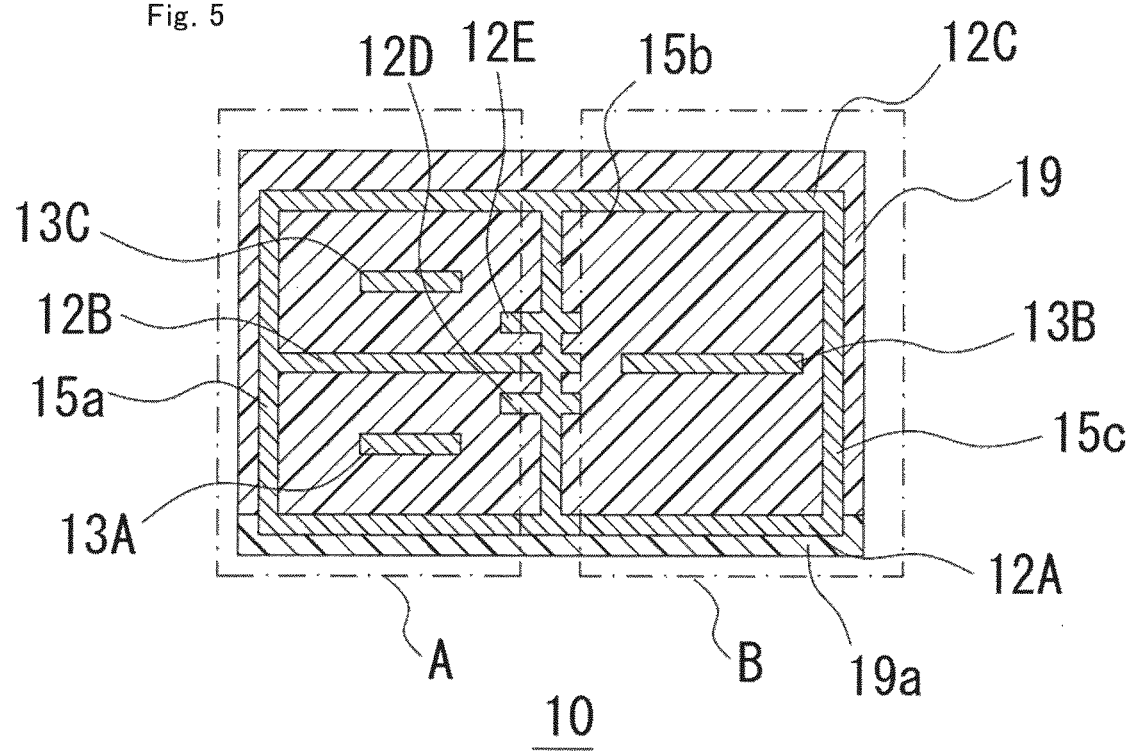
FIG. 5 is another exemplary cross-sectional view in the parallel extending portion of the multilayer board according to the first preferred embodiment of the present invention.

FIG. 5 is a cross-sectional view of the multilayer board including auxiliary ground conductors extending in the transmission direction provided between the signal conductors 13A, 13C and the signal conductor 13B, showing a cross section of the parallel extending portion corresponding to the cutting line a-a' of FIG. 3 with the mounting surface facing downward. In FIG. 5, the resist 19a covering the ground conductor 12A is disposed on the mounting surface side of the multilayer board. In FIG. 5, an auxiliary ground conductor 12D connected to the second interlayer connection conductor 15b is disposed between the signal conductors 13A and 13B separately from each of the signal conductors 13A and 13B in the width direction of the parallel extending portion and the lamination direction. An auxiliary ground conductor 12E connected to the second interlayer connection conductor 15b is disposed between the signal conductors 13B and 13C separately from the signal conductors 13B and 13C in the width direction of the parallel extending portion and the lamination direction. By providing the auxiliary ground conductor 12D, the isolation between the signal conductors 13A and 13B is able to be further improved. By providing the auxiliary ground conductor 12E, the isolation between the signal conductors 13C and 13B is able to be further improved. The auxiliary ground conductors 12D and 12E preferably have a flat plate shape extending in the transmission direction, for example.

Figure 6:
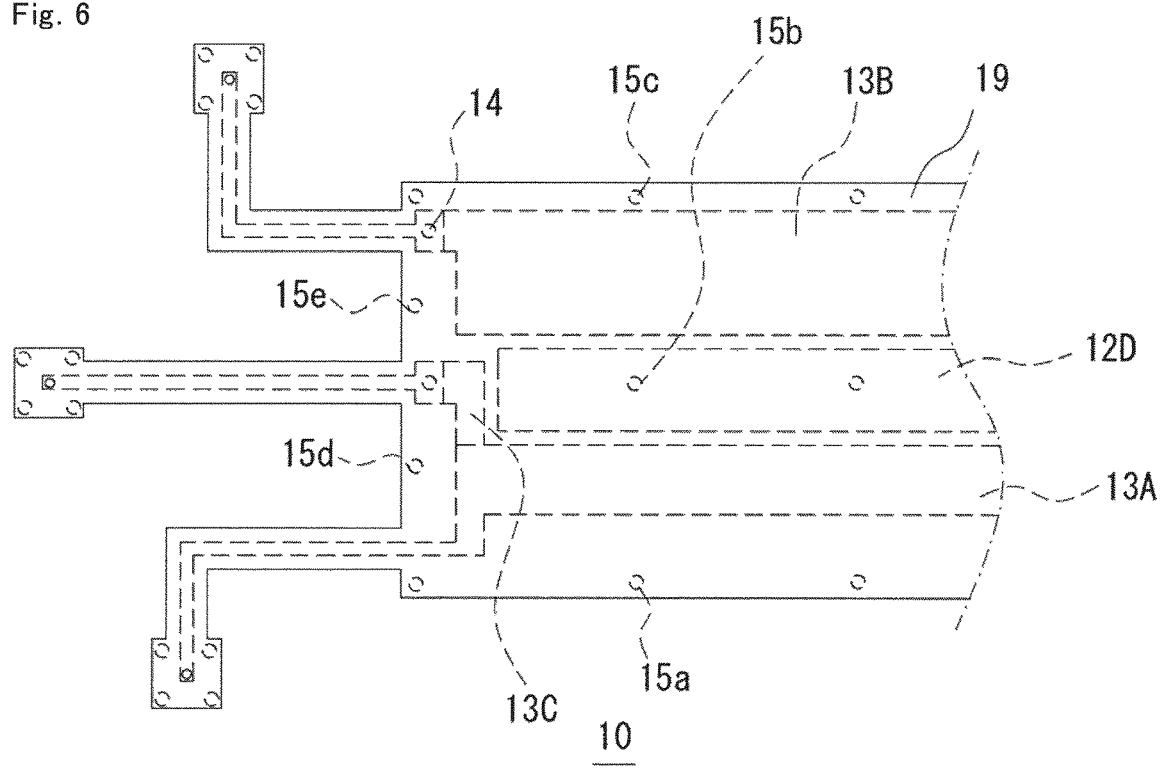
FIG. 6 is an exemplary transparent plan view of the multilayer board including auxiliary ground conductors in the parallel extending portion.

FIG. 6 is an exemplary transparent plan view of the parallel extending portion of the multilayer board 10 including the auxiliary ground conductors 12D and 12E connected to the second interlayer connection conductor 15b as viewed from the mounting surface side. In FIG. 6, for simplicity, the ground conductors 12A, 12B, and 12C are not shown. In FIG. 6, the auxiliary ground conductor 12D connected to the second interlayer connection conductors 15b is provided inside the laminated insulating body 19 defined by a flat plate-shaped conductor continuously extended in the transmission direction between the signal conductors 13B and 13A. The auxiliary ground conductor 12E is hidden behind the auxiliary ground conductor 12D. The auxiliary ground conductor 12D is connected to the second interlayer connection conductor 15a via the ground conductors 12A, 12B, and 12C not shown and is connected to the second interlayer connection conductors 15c, 15d, and 15e via the ground conductors 12A and 12C. In a planar view, the signal conductor 13A is surrounded by the auxiliary ground conductor 12D and the second interlayer connection conductors 15a and 15b, and the signal conductor 13B is surrounded by the auxiliary ground conductor 12D and the second interlayer connection conductors 15b and 15c. The auxiliary ground conductors 12D and 12E may have the same width or different widths.

Figure 7:
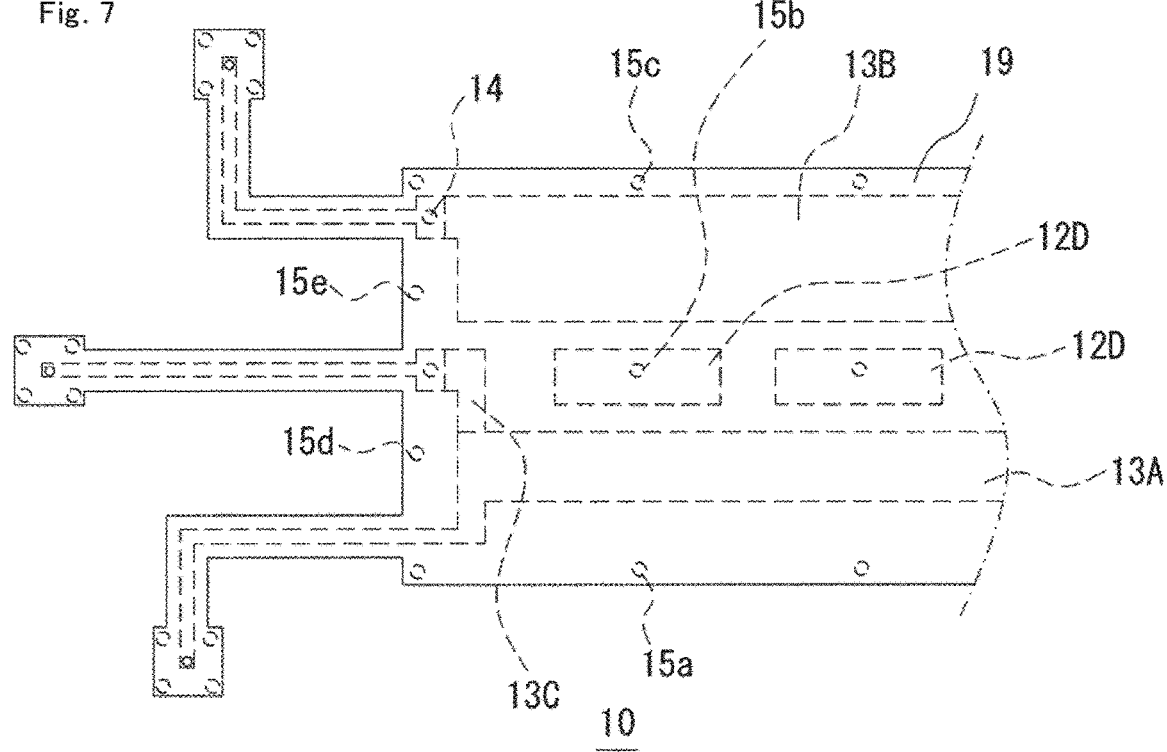
FIG. 7 is another exemplary transparent plan view of the multilayer board including auxiliary ground conductors in the parallel extending portion.

FIG. 7 is another exemplary transparent plan view of the parallel extending portion of the multilayer board 10 including the auxiliary ground conductors 12D and 12E connected to the second interlayer connection conductors 15b as viewed from the mounting surface side. In FIG. 7, for simplicity, the ground conductors 12A, 12B, and 12C are not shown. In FIG. 7, the auxiliary ground conductors 12D respectively connected to the second interlayer connection conductors 15b are provided inside the laminated insulating body 19 defined by rectangular or substantially rectangular flat plates provided separately from each other in the transmission direction between the signal conductors 13B and 13A. The auxiliary ground conductors 12E are hidden behind the auxiliary ground conductors 12D. In a planar view, the signal conductor 13A is surrounded by the auxiliary ground conductors 12D and the second interlayer connection conductors 15a and 15b, and the signal conductor 13B is surrounded by the auxiliary ground conductors 12D and the second interlayer connection conductors 15b and 15c. The auxiliary ground conductors 12D preferably have a rectangular or substantially rectangular shape in FIG. 7 or may have a polygonal shape, a circular shape, an elliptical shape, an oval shape, etc. The auxiliary ground conductors 12D and 12E may have the same shape or different shapes.

Figure 8:
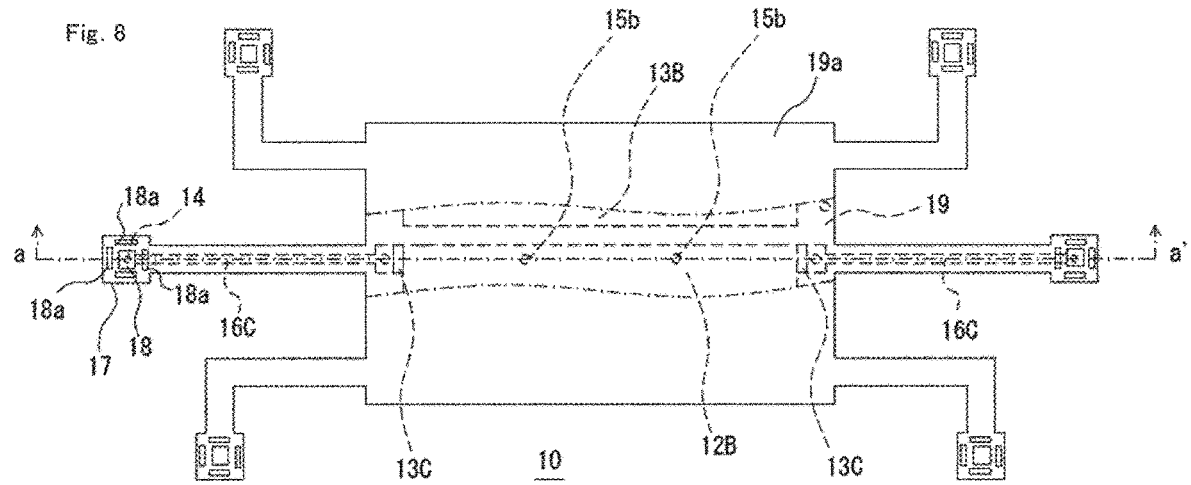
FIG. 8 is a partially transparent plan view of the multilayer board including a resist on a mounting surface as viewed from the mounting surface side.

FIG. 8 is a partially transparent plan view of the multilayer board 10 on which the resist 19a covering the ground conductor 12A is provided on the mounting surface side as viewed from the mounting surface side. The ground conductors 12A and 12C are not shown in a transparent potion. In FIG. 8, in the connection terminal portion 17, the terminal electrode 18, and ground electrodes 18a surrounding the terminal electrode 18 are exposed from opening portions of the resist 19a. The ground electrodes 18a are exposed surfaces of the ground conductor 12A in the opening portions of the resist 19a, for example.

Figure 9:
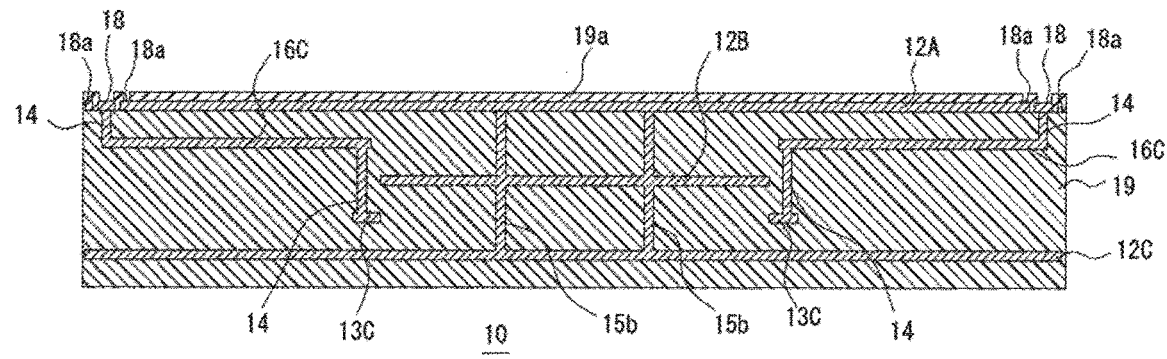
FIG. 9 is an exemplary cross-sectional view of the multilayer board including the resist on the mounting surface.

FIG. 9 is a cross-sectional view of the multilayer board including the resist 19a on the mounting surface side taken along a line a-a' of FIG. 8 and is a cross-sectional view taken with the mounting surface facing upward. In FIG. 9, the ground conductor 12C built into the laminated insulating body 19 and the ground conductor 12A disposed on the surface of the laminated insulating body 19 on the mounting surface side are continuously disposed in the lead-out portion and the parallel extending portion. The resist 19a is disposed on the surface of the ground conductor 12A on the mounting surface side. The ground conductors 12A and 12C are connected, together with the ground conductor 12B disposed therebetween, in the lamination direction via the second interlayer connection conductor 15b. The ground conductor 12B is provided in the same layer as the signal conductor 13B (not shown) included in the second region. The ground conductor 12B and the ground conductor 12A sandwich the signal conductor 13A provided in the same layer as the lead-out conductor 16C in the transmission direction in the first region. The ground conductor 12B and the ground conductor 12C sandwich the signal conductor 13C in the first region. This improves the isolation between the signal conductors and reduces or prevents crosstalk.

The lead-out conductor 16C in the transmission direction disposed in the lead-out portion is sandwiched between the ground conductors 12A and 12C, so that unnecessary radiation to the outside is reduced or prevented. The end portion of the lead-out conductor 16C on the connection terminal portion 17 side is connected to the terminal electrode 18 disposed on the mounting surface via the first interlayer connection conductor 14 disposed through the insulating base material layer. The resist 19a is not disposed on a portion of the surface of the terminal electrode 18 on the mounting surface side, and the surface is exposed on the mounting surface side. The ground electrodes 18a are provided around the terminal electrode 18 as exposed portions of the ground conductor 12A in the opening portions of the resist 19a. The other end portion of the lead-out conductor 16C on the side opposite to the connection terminal portion 17 is connected to the end portion of the signal conductor 12C via the first interlayer connection conductor 14 disposed in the lamination direction through the insulating base material layer.

FIG. 10 is a cross-sectional view of the multilayer board 10 including connectors 18b on the connection terminal portion 17 corresponding to the line a-a' of FIG. 8 and is a cross-sectional view taken with the mounting surface facing upward. In FIG. 10, the resist 19a covering the ground conductor 12A is disposed on the mounting surface side. The connectors 18b are each disposed on the resist 19a of the connection terminal portion 17, and the terminal electrode 18 exposed from the resist 19a and the exposed portions of the ground conductor 12A in the opening portions of the resist 19a are connected respectively via connection materials 18c to the connector 18b. For example, solder may preferably be used for the connection materials 18c. The connector 18b is connected via the connection material 18c, the terminal electrode 18, the first interlayer connection conductor 14, and the lead-out conductor 16C to the signal conductor 13C and is connected via the connection material 18c to the ground conductor 12A.

FIG. 11 is a schematic cross-sectional view for explaining a method of mounting the multilayer board 10 including the connectors 18b in the connection terminal portion 17 onto a mounting board 100. Each of the connectors 18b of the multilayer board 10 is connected via the connection material 18c, the terminal electrode 18, the first interlayer connection conductor 14, and the lead-out conductor 16C to the signal conductor 13C. Each of the connectors 18b is connected via the connection material 18c to the exposed portions of the ground conductor 12A in the opening portions of the resist 19a. The mounting board 100 includes a resist 102 disposed on an insulating base material layer 101 and partially exposing terminal portions 103a and 103b. The terminal portions 103a and 103b are connected via connection materials not shown to connectors 104a and 104b, respectively. The terminal portions 103a and 104b each include a signal terminal and a ground terminal, for example. The two connectors 18b of the multilayer board 10 are respectively connected to the connectors 104a and 104b of the mounting board 100, so that the multilayer board 10 is mounted on the mounting board 100. When the multilayer board 10 is mounted on the mounting board 100, the signal terminal of 103a of the mounting board 100 is connected sequentially via the connector 104a, the connector 18b, the connection material 18c, the terminal electrode 18, the first interlayer connection conductor 14, the lead-out conductor 16C, and the first interlayer connection conductor 14 to one end portion of the signal conductor 13C. The other end portion of the signal conductor 13C is connected sequentially via the first interlayer connection conductor 14, the lead-out conductor 16C, the first interlayer connection conductor 14, the terminal electrode 18, the connection material 18c, the connector 18b, and the connector 104b to the signal terminal of 103b of the mounting board 100. As a result, the signal terminal of the terminal portion 103a and the signal terminal of the terminal portion 103b of the mounting board 100 are connected to the multilayer board 10. The ground terminals of 103a and 103b of the mounting board 100 are connected sequentially via the connector 104a, the connector 18b, and the connection material 18c to the ground electrode 18a integrally formed with the ground conductor 12A. Therefore, a signal is transmitted between the terminal portions 103a and 103b of the mounting board 100 to the multilayer board 10.

Figure 12:
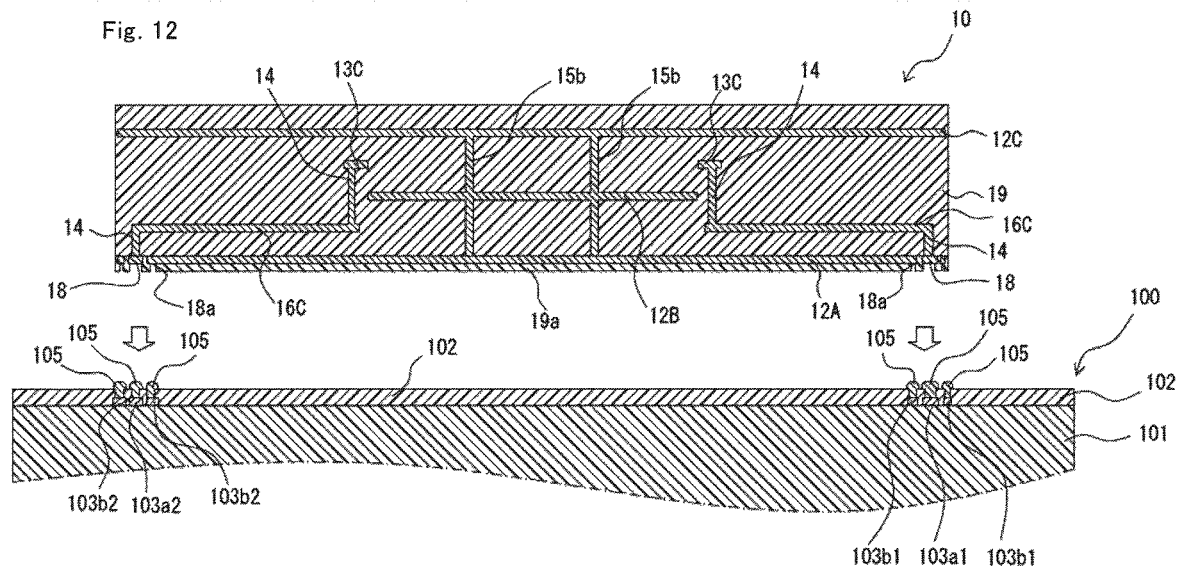
FIG. 12 is a schematic for explaining a mounting method of the multilayer board including the resist on the mounting surface.

FIG. 12 is a schematic cross-sectional view for explaining another example of the method of mounting the multilayer board 10 onto the mounting board 100. The mounting board 100 includes the resist 102 disposed on the insulating base material layer 101 and partially exposing signal terminals 103a1 and 103a2 and ground terminals 103b1 and 103b2. Connection materials 105 are respectively disposed on the signal terminals 103a1 and 103a2 and the ground terminals 103b1 and 103b2. For example, solder is preferably used for the connection materials 105. The terminal electrodes 18 and the ground electrodes 18a of the connection terminal portions 17 are connected via the connection materials 105 to the signal terminals and the ground terminals of the mounting board, so that the multilayer board 10 is mounted on the mounting board. When the multilayer board 10 is mounted on the mounting board 100, the signal terminal of 103a1 of the mounting board 100 is connected sequentially via the connection material 105, the terminal electrode 18, the first interlayer connection conductor 14, the lead-out conductor 16C, and the first interlayer connection conductor 14 to one end portion of the signal conductor 13C. The other end portion of the signal conductor 13C is connected sequentially via the first interlayer connection conductor 14, the lead-out conductor 16C, the first interlayer connection conductor 14, the terminal electrode 18, and the connection material 105 to the signal terminal 103a2 of the mounting board 100. As a result, the signal terminal 103a1 and the signal terminal 103a2 of the mounting board 100 are connected to the multilayer board 10. The ground terminals 103b1 and 103b2 of the mounting board 100 are respectively connected via the connection materials 105 to the ground electrodes 18a that are exposed portions of the ground conductor 12A in the opening portions of the resist 19a of the multilayer board 10.

Figure 13:
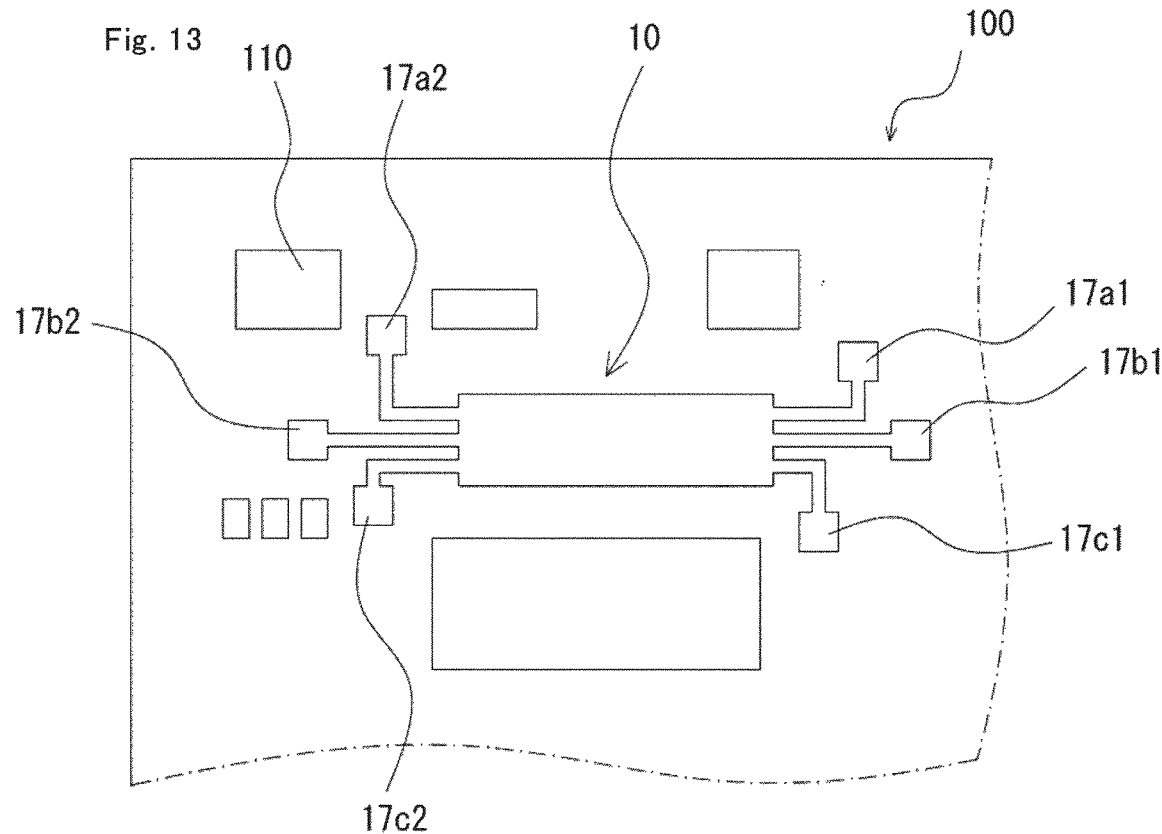
FIG. 13 is a plan view showing an example of a mounting board with the multilayer board mounted thereon.

FIG. 13 is a plan view schematically showing a mounting state of the multilayer board 10 on the mounting board 100.

The multilayer board 10 and other electronic components 110 are provided on the mounting board 100. The electronic components 110 include chip components, such as integrated circuits (ICs), resistors, capacitors, and inductors, for example. The multilayer board 10 includes connection terminal portions 17a1, 17b1, 17c1, 17a2, 17b2, and 17c2 respectively connected to terminal portions on the mounting board and is thus mounted on the mounting board. The connection terminal portions are connected to the terminal portions on the mounting board through connectors or a connection material, such as solder, for example. For example, the terminal portion connected to the terminal portion 17a1 of the multilayer board 10 is connected to the terminal portion connected to the terminal portion 17a2 via the multilayer board 10, and the terminal portion connected to the terminal portion 17b1 of the multilayer board 10 is connected to the terminal portion 17b2 via the multilayer board 10, and the terminal portion connected to the terminal portion 17c1 of the multilayer board 10 is connected to the terminal portion connected to the terminal portion 17c2 via the multilayer board 10.

Figure 14:
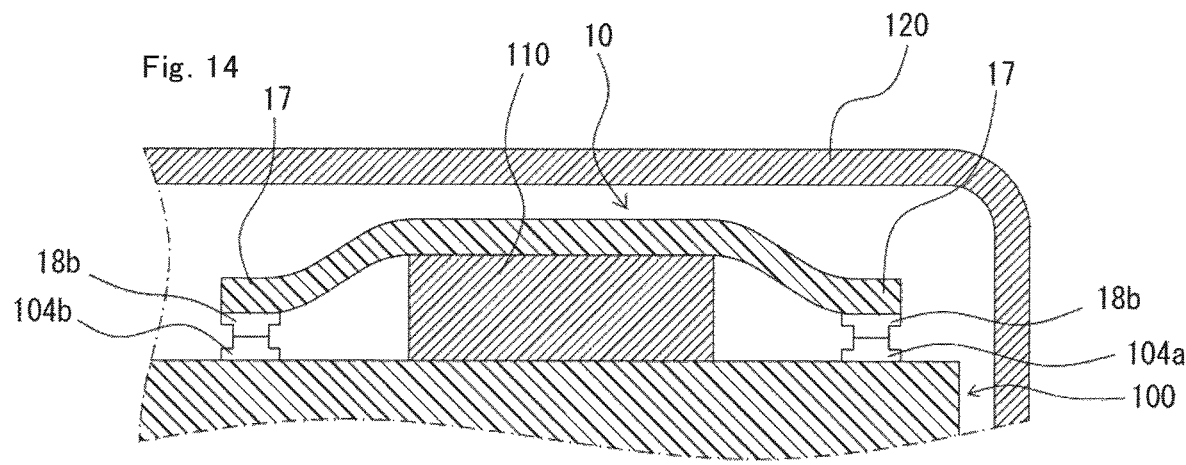
FIG. 14 is a side view showing another example of a mounting board with the multilayer board mounted thereon.

FIG. 14 is a plan view schematically showing the mounting board 100 including the multilayer board 10 mounted thereon and housed in a housing 120. In FIG. 14, the connectors 18b provided on the connection terminal portions 17 of the multilayer board 10 are respectively connected to the connectors 104a and 104b provided on the mounting board 100, so that the multilayer board 10 is mounted on the mounting board 100 over the electronic component 110. The multilayer board 10 is then housed in the housing 120. The multilayer board 10 includes the signal conductors provided in the first and second regions in the width direction of the parallel extending portion. As a result, the thickness of the entire multilayer board 10 is able to be thinner as compared to when all of the signal conductors are provided in the lamination direction. Therefore, by using a flexible base material, such as a liquid crystal polymer (LCP), for example, for the insulating base material layer of the multilayer board 10, the multilayer board 10 is able to be bent and disposed depending on a shape of a gap between the mounting board 100 including the electronic components 110 provided thereon and the housing 120.

Second Preferred Embodiment

Figure 15:
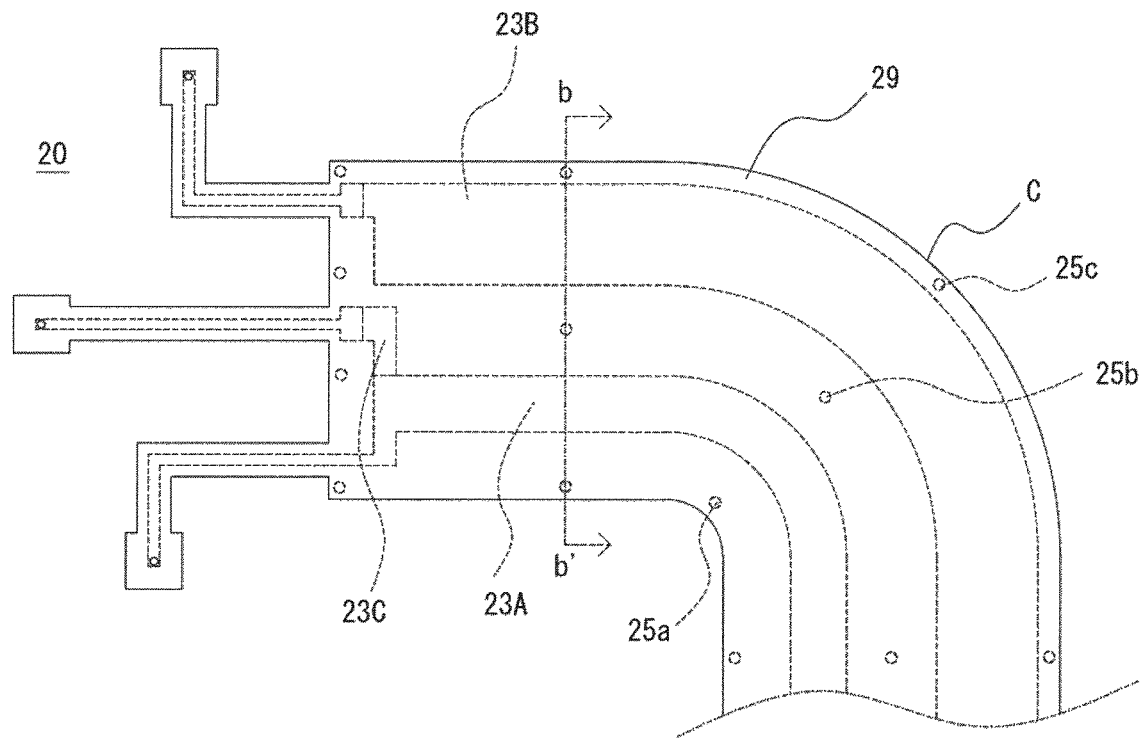
FIG. 15 is a transparent plan view of a multilayer board according to a second preferred embodiment of the present invention.

FIG. 15 is a transparent plan view of a multilayer board according to a second preferred embodiment of the present invention as viewed from the mounting surface side. In FIG. 15, for simplicity, the ground conductors are not shown. The multilayer board 20 of the second preferred embodiment has the same or substantially the same configuration as the multilayer board of the first preferred embodiment except that the multilayer board includes a curved portion C with a transmission direction that is bent along a plane orthogonal or substantially orthogonal to the lamination direction in the parallel extending portion and that the first region is disposed at an inner position in the curved portion C. The multilayer board having the curved portion in the parallel extending portion is mounted to detour around the electronic component 110 of FIG. 13, for example.

In the multilayer board 20, signal conductors 23A, 23B, and 23C extend in the transmission direction inside a laminated insulating body 29. The signal conductors 23A and 23B are arranged separately from each other in the width direction of the parallel extending portion orthogonal or substantially orthogonal to the signal transmission direction. The signal conductor 23C overlaps with the signal conductor 23A in the lamination direction and is disposed separately from the signal conductor 23A in the lamination direction. In the multilayer board 20, the first region including a larger number of signal conductors laminated to overlap as viewed in the lamination direction is disposed at a position on the inner side relative to the second region in the curved portion C. In FIG. 15, the first region includes the signal conductors 23A and 23C, and the second region includes the signal conductor 23B. The first region and the second region are sectioned in the width direction of the parallel extending portion along the transmission direction.

In FIG. 15, a plurality of second interlayer connection conductors 25b interconnecting ground conductors not shown are provided along the transmission direction between the signal conductors 23A, 23C and the signal conductor 23B. Additionally, a plurality of second interlayer connection conductors 25a and 25c interconnecting the ground conductors are provided along the transmission direction in the outer edge portion of the parallel extending portion. By providing the plurality of the second interlayer connection conductors 25a and 25c along the transmission direction in the outer edge portion of the parallel extending portion, unnecessary radiation from the signal conductors to the outside is able to be effectively reduced or prevented. Particularly, since the plurality of the second interlayer connection conductors 25a are provided in the outer edge portion of the parallel extending portion on the inner side of the curved portion C of the multilayer board 20, an influence of crosstalk, for example, is able to be more effectively reduced or prevented from occurring due to unnecessary radiation between different positions of the adjacent signal conductors on the inner side of the curved portion C. Although the same numbers of the second interlayer connection conductors 25a, 25b, and 25c are provided along the transmission direction in FIG. 15, the second interlayer connection conductors 25a, 25b, and 25c may be provided in respective different numbers. For example, the number of the second interlayer connection conductors 25a provided on the inner side of the curved portion C may be larger or smaller than the number of the second interlayer connection conductors 25c provided on the outer side of the curved portion C. The second interlayer connection conductors 25a, 25b, and 25c may respectively be arranged at equal or substantially equal intervals.

Furthermore, the multilayer board 20 may include an auxiliary ground conductor (not shown) extending in the transmission direction, in addition to the ground conductors and the second interlayer connection conductors 25a to 25c. By including the auxiliary ground conductor, the isolation between the signal conductors is able to be further improved. For example, the auxiliary ground conductor may preferably be a continuous flat plate-shaped conductor along the transmission direction or may be flat plate-shaped conductors separated from each other along the transmission direction.

A cross-sectional view of the multilayer board 20 showing a cross section of the parallel extending portion taken along a cutting line b-b' of FIG. 15 with the mounting surface facing downward is the same as FIG. 4. In the multilayer board 20, an interval between the two ground conductors sandwiching the signal conductor included in the first region A is preferably smaller than an interval between the two ground conductors sandwiching the signal conductor in the second region B. Since the signal conductors included in the first region A on the inner side of the curved portion C are sandwiched by the ground conductors at narrow intervals, an influence of crosstalk, for example, is able to be effectively reduced or prevented from occurring due to unnecessary radiation between different positions of the adjacent signal conductors on the inner side of the curved portion C.

Figure 16:
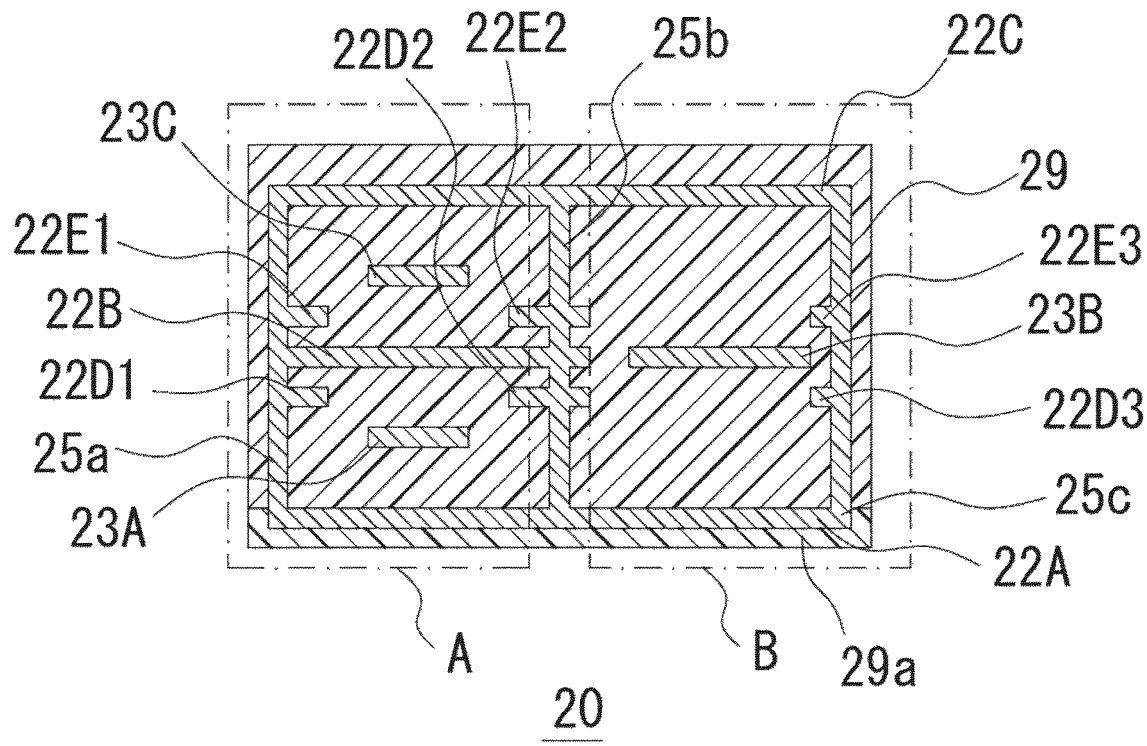
FIG. 16 is an exemplary cross-sectional view in the parallel extending portion of the multilayer board according to the second preferred embodiment of the present invention.

FIG. 16 is a cross-sectional view of the multilayer board including auxiliary ground conductors extending in the transmission direction disposed between the signal conductors 23A, 23C and the signal conductor 23B and in the outer edge portion of the parallel extending portion, showing a cross section of the parallel extending portion corresponding to the cutting line b-b' of FIG. 15 with the mounting surface facing downward. The multilayer board 20 includes, in the order from the side closer to the mounting surface, the signal conductor 23A, the conductor 23B disposed separately from the signal conductor 23A in the width direction of the parallel extending portion as viewed in the lamination direction, and the signal conductor 23C including an overlap with the signal conductor 23A as viewed in the lamination direction and disposed separately therefrom in the lamination direction, provided inside the laminated insulating body 29. In the multilayer board 20, the signal conductor 23A is sandwiched between ground conductors 22A and 22B via the insulating base material layer, the signal conductor 23B is sandwiched between ground conductors 22A and 22C via the insulating base material layer, and the signal conductor 23C is sandwiched between the ground conductors 22B and 22C via the insulating base material layer. The ground conductors 22B and 22C are built into the laminated insulating body 29, and the ground conductor 22A is disposed on the surface on the mounting surface side of the laminated insulating body 29. In FIG. 16, a resist 29a covering the ground conductor 22A is provided on the mounting surface side of the laminated insulating body 29.

In FIG. 16, an auxiliary ground conductor 22D2 connected to the second interlayer connection conductor 25b is disposed between the signal conductors 23A and 23B separately from the signal conductors 23A and 23B in the width direction of the parallel extending portion and the lamination direction. An auxiliary ground conductor 22E2 connected to the second interlayer connection conductor 25a is disposed between the signal conductors 23B and 23C separately from the signal conductors 23B and 23C in the width direction of the parallel extending portion and the lamination direction. In the outer edge portion of the first region A, auxiliary ground conductors 22D1 and 22E1 connected to the second interlayer connection conductor 25a are provided with the ground conductor 22B interposed between the signal conductors 23A and 23C. In the outer edge portion of the second region B, auxiliary ground conductors 22D3 and 22E3 connected to the second interlayer connection conductor 25c are disposed separately from each other in the lamination direction. Since the auxiliary ground conductors 22D1, 22E1, 22D3, and 22E32 are provided in the outer edge portion of the parallel extending portion, the unwanted radiation from the signal conductors 23A, 23B, and 23C to the outside is able to be more effectively reduced or prevented. Particularly, since the auxiliary ground conductors 22D1 and 22E1 are provided on the inner side of the curved portion C, an influence of crosstalk, for example, is able to be effectively reduced or prevented from occurring due to unnecessary radiation between different positions of the adjacent signal conductors on the inner side of the curved portion C.

Figure 17:
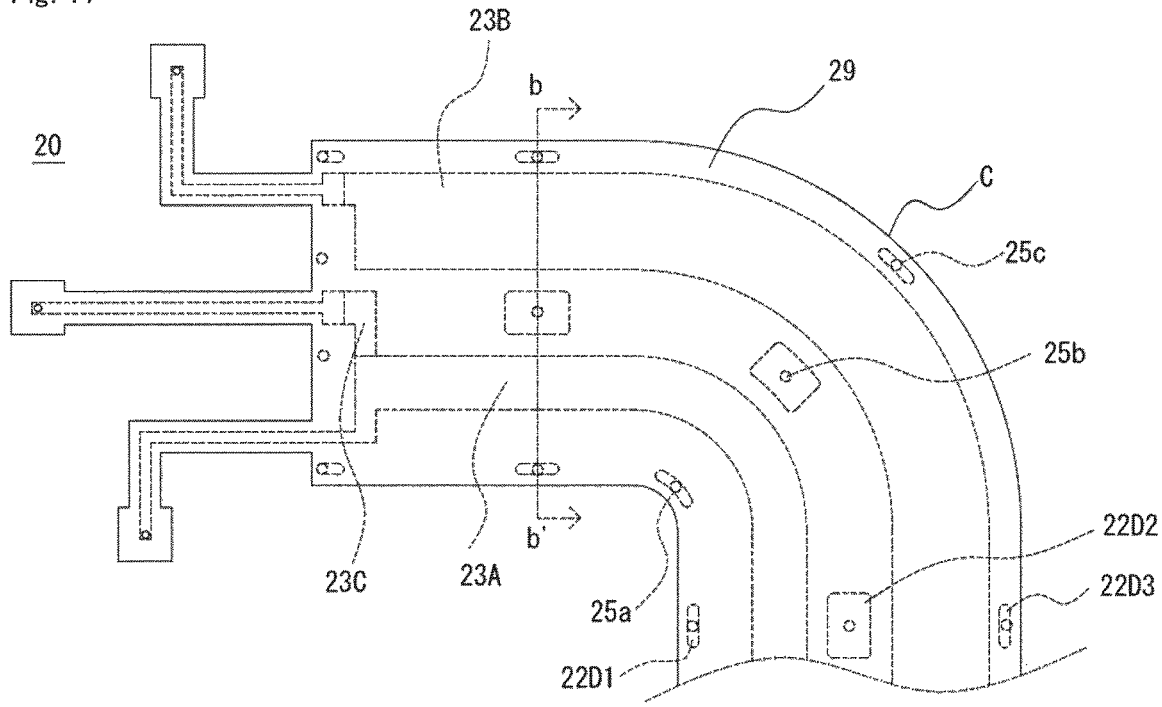
FIG. 17 is an exemplary transparent plan view of the multilayer board including auxiliary ground conductors in the parallel extending portion.

FIG. 17 is an exemplary transparent plan view of the parallel extending portion of the multilayer board 20 including the auxiliary ground conductors 22D1 to 22D3 and 22E1 to 22E3 connected to the second interlayer connection conductor 25b as viewed from the mounting surface side. In FIG. 17, for simplicity, the ground conductors 12A, 12B, and 12C are not shown. In FIG. 17, the auxiliary ground conductors 22D1 connected to the second interlayer connection conductor 25a are preferably oblong flat plate-shaped conductors separately from each other along the transmission direction in the outer edge portion of the parallel extending portion inside the laminated insulating body 29. The auxiliary ground conductors 22E1 are hidden behind the auxiliary ground conductors 22D2. The auxiliary ground conductors 22D2 connected to the second interlayer connection conductor 25a are preferably oblong flat plate-shaped conductors provided separately from each other along the transmission direction between the signal conductors 23B and 23A. The auxiliary ground conductors 22E2 are hidden behind the auxiliary ground conductors 22D2. The auxiliary ground conductors 22D3 connected to the second interlayer connection conductor 25C are preferably oblong flat plate-shaped conductors separately from each other along the transmission direction in the outer edge portion of the parallel extending portion. The auxiliary ground conductors 22D1, 22D2, and 22D3 are interconnected via the ground conductors 22A, 22B, and 22C not shown. In a planar view, the signal conductor 23A is surrounded by the auxiliary ground conductors 22D1 and 22D2, and the signal conductor 13B is surrounded by the auxiliary ground conductors 22D2 and 22D3. The auxiliary ground conductors 22D1 and 22D3 preferably have the same or substantially the same width, which is different from the width of the auxiliary ground conductor 22D2.

Third Preferred Embodiment

Figure 18:
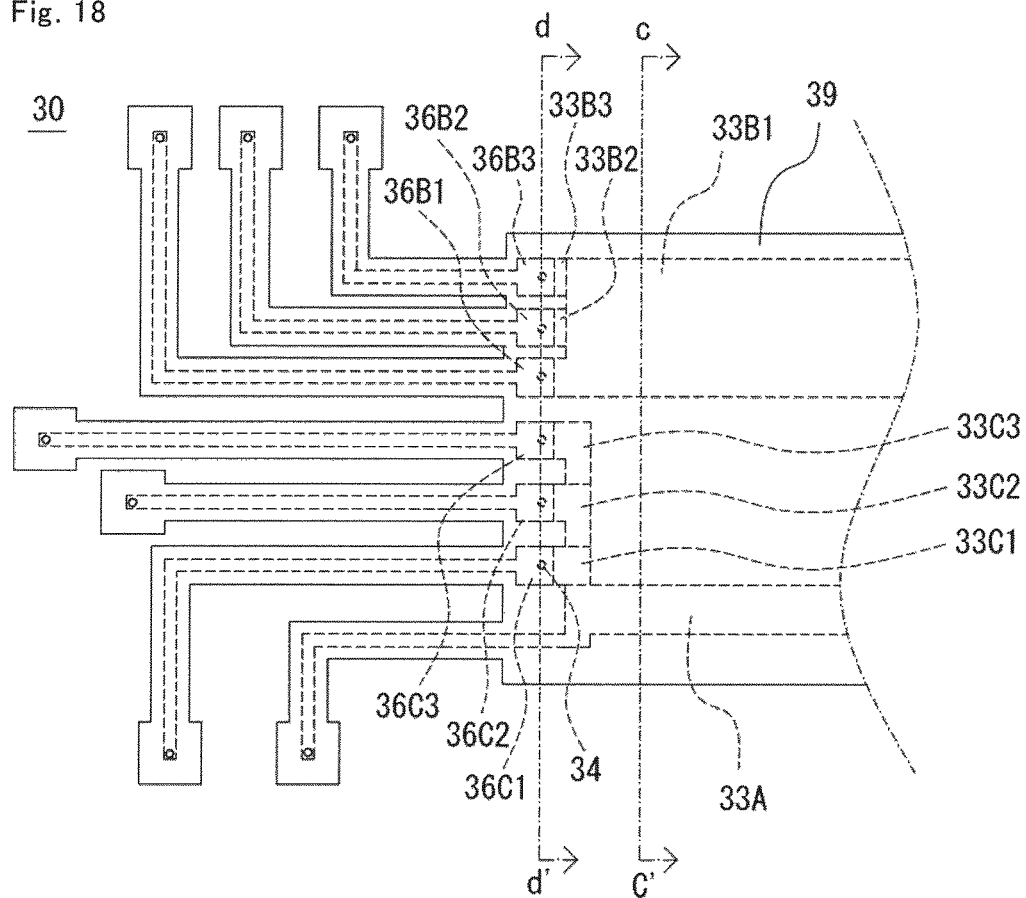
FIG. 18 is a transparent plan view of a multilayer board according to a third preferred embodiment of the present invention.

FIG. 18 is a transparent plan view of a multilayer board according to a third preferred embodiment of the present invention as viewed from the mounting surface side. In FIG. 18, for simplicity, the ground conductors are not shown. The multilayer board 30 of the third preferred embodiment has the same or substantially the same configuration as the multilayer board of the first preferred embodiment except that the first region includes four signal conductors while the second region includes three signal conductors and that signal conductors that overlap in the lamination direction are provided such that a total length of lead-out conductors in the lamination direction is shorter as compared to when the signal conductors are arranged at equal or substantially equal intervals in the lamination direction.

The parallel extending portion of the multilayer board 30 is sectioned in the width direction of the parallel extending portion along the transmission direction into a first region including signal conductors 33A, 33C1, 33C2, and 33C3 and a second region including signal conductors 33B1, 33B2, and 33B3.

The signal conductor 33A is integral with a lead-out conductor in the transmission direction on the same surface of the insulating base material layer. The signal conductors 33B1 to 33B3 are connected at respective end portions in the transmission direction via first interlayer connection conductors 34 respectively to end portions of lead-out conductors in the parallel extending portion. The signal conductors 33C1 to 33C3 include lead-out portions in the width direction of the parallel extending portion at respective end portions in the transmission direction and are connected at the lead-out portions via the first interlayer connection conductors 34 to the end portions of lead-out conductors in the parallel extending portion.

Figure 19:
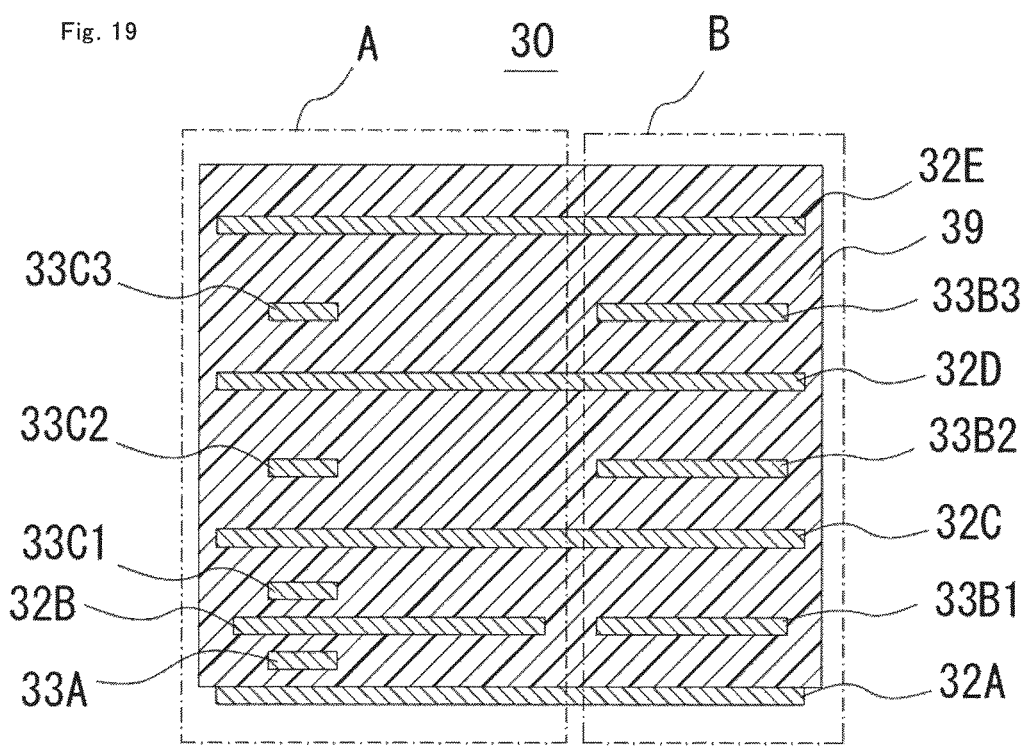
FIG. 19 is an exemplary cross-sectional view in the parallel extending portion of the multilayer board according to the third preferred embodiment of the present invention.

FIG. 19 is a cross-sectional view of the multilayer board 30 showing a cross section of the parallel extending portion taken along a cutting line c-c' of FIG. 18 with the mounting surface facing downward. In FIG. 19, no resist covering the ground conductor 32A is provided on the mounting surface side of the laminated insulating body. The multilayer board 30 includes the first region A in which the signal conductor 33A (hereinafter also referred to as a first signal conductor) and the signal conductors 33C1 to 33C3 (hereinafter all also referred to as third signal conductors) arranged separately from each other in the lamination direction are provided in the order from the side closer to the mounting surface inside the laminated insulating body 19. In the second region B, the signal conductors 33B1 to 33B3 (hereinafter all also referred to as second signal conductors) are provided in the order from the side closer to the mounting surface inside the laminated insulating body 19. The second signal conductors 33B1 to 33B3 are arranged separately from the signal conductor 33A in the width direction of the parallel extending portion when viewed in the lamination direction. The third signal conductors 33C1 to 33C3 overlap with the signal conductor 33A when viewed in the lamination direction.

In FIG. 19, an interval between the ground conductors 32A and 32B sandwiching the first signal conductor 33A and an interval between the ground conductors 32B and 32C sandwiching the third signal conductor 33C1 are narrower than an interval between the ground conductors 32A and 32C sandwiching the second signal conductor 33B1. The line widths of the second signal conductors 33B1 to 33B3 included in the second region B are wider than the line widths of the first signal conductor 33A and the third signal conductors 33C1 to 33C3 included in the first region A.

In the first region A of the multilayer board 30, the signal conductors arranged along the lamination direction are provided at a higher density on the mounting surface side. Specifically, when the multilayer board 30 is divided into two regions by a plane passing through a middle point of the thickness thereof and orthogonal or substantially orthogonal to the thickness direction, the number of signal conductors included in the region on the mounting surface side is larger than a number of signal conductors included in the region on the side opposite to the mounting surface side.

FIG. 20 is a cross-sectional view of the multilayer board 30 showing a cross section of the parallel extending portion taken along a cutting line d-d' of FIG. 18 with the mounting surface facing downward. In FIG. 20, no resist covering the ground conductor 32A is provided on the mounting surface side of the laminated insulating body. In the multilayer board 30, the end portions of the signal conductors 33B1 to 33B3 and 33C1 to 33C3 are respectively connected via the first interlayer connection conductors 34 extending along the lamination direction from the signal conductors toward the mounting surface to the end portion of the lead-out conductors 36B1 to 36B3 and 36C1 to 36C3 in the transmission direction in the parallel extending portion. The first interlayer connection conductors 34 are provided such that the first interlayer connection conductors provided through the insulating base material layers are connected between the layers in the lamination direction.

In the second region B of FIG. 20, the signal conductors 33B1 to 33B3 are arranged at equal or substantially equal intervals in the lamination direction. In the first region A, the signal conductors 33A and 33C1 to 33C3 are provided such that the total length of the first interlayer connection conductors 34 is shorter as compared to when the signal conductors are arranged at equal or substantially equal intervals in the lamination direction.

The ground conductors are connected by the second interlayer connection conductors provided through the insulating base material layers in the preferred embodiments described above or may be connected by through-holes, instead of the interlayer connection conductors. The ground conductors may be connected by a side conductor layer disposed along the lamination direction at end portions in the width direction in the parallel extending portion. The side conductor layer is disposed at both end portions in the width direction, for example. The ground conductors and the side conductor layer may be connected by extending the ground conductors to the end portions in the width direction or may be connected by providing lead-out conductors from the ground conductors to the end portions in the width direction. The side conductor layer may be provided by plating on the side surface of the multilayer board, for example. Furthermore, the side conductor layer may be provided on the entire or substantially the entire side surface of the parallel extending portion along the transmission direction or may be defined by a plurality of side conductor layers arranged separately from each other along the transmission direction and extend along the lamination direction.

The multilayer boards according to the preferred embodiments described above are each used as a transmission line for high frequency signals. Although the application of the first and third signal conductors and the second signal conductor included in the multilayer board is not particularly limited, for example, the second signal conductor may be made wider than the first and third signal conductors and is therefore suitable for signal transmission in which a lower loss is required, for example, signal transmission in a higher frequency band. On the other hand, the first signal conductor and the third signal conductor are sandwiched between the ground conductors at a narrower interval and are therefore suitable for signal transmission in which more isolation is required, for example, signal transmission in a lower frequency band.

All the documents, patent applications, and technical standards described in this description are hereby incorporated by reference to the same extent as if each of the documents, patent applications, and technical standards is specifically and individually described as being incorporated by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer board comprising:
a laminated insulating body including a plurality of insulating base material layers that are laminated;
three or more signal conductors provided inside the laminated insulating body and extending in a transmission direction of a signal along the plurality of insulating base material layers; and
a plurality of ground conductors sandwiching each of the three or more signal conductors in a lamination direction via the plurality of insulating base material layers; wherein
the multilayer board includes a parallel extending portion in which the three or more signal conductors extend parallel to transmit a high frequency signal;
the parallel extending portion includes two or more signal conductors of the three or more signal conductors arranged separately from each other in a direction orthogonal or substantially orthogonal to the transmission direction in a planar view in the lamination direction, and at least one other signal conductor of the three or more signal conductors that overlaps with at least one of the two or more signal conductors in the planar view in the lamination direction and arranged separately from the two or more signal conductors in the lamination direction;

the parallel extending portion includes a first region and at least one second region respectively including the two or more signal conductors arranged separately from each other in the direction orthogonal or substantially orthogonal to the transmission direction in the planar view in the lamination direction;

a number of the signal conductors of the three or more signal conductors in the first region that overlap in the lamination direction is larger than a number of the signal conductors of the three or more signal conductors in the at least one second region that overlap in the lamination direction;

the first region includes a portion in which an interval between the plurality of ground conductors sandwiching the signal conductors of the three or more signal conductors is smaller than a minimum value of an interval between the plurality of ground conductors sandwiching the signal conductors of the three or more signal conductors in the at least one second region;

the parallel extending portion includes a curved portion including the transmission direction that is bent along a plane orthogonal or substantially orthogonal to the lamination direction; and the first region is disposed at a position on an inner side relative to the at least one second region in the curved portion.

2. The multilayer board according to claim 1, wherein the signal conductors of the three or more signal conductors in the at least one second region are wider than the signal conductors of the three or more signal conductors in the first region.

3. The multilayer board according to claim 1, wherein lead-out conductors respectively connected to the three or more signal conductors and led out toward a mounting surface in the lamination direction are provided at an end portion in the transmission direction; and the three or more signal conductors that overlap in the lamination direction are arranged such that a total length of the lead-out conductors is shorter than a structure in which the three or more signal conductors are arranged at equal or substantially equal intervals in the lamination direction.

4. The multilayer board according to claim 3, wherein the lead-out conductors are respectively integrated with the three or more signal conductors.

5. The multilayer board according to claim 1, further comprising at least one interlayer connection conductor connecting the plurality of ground conductors in the lamination direction, between the signal conductors of the three or more signal conductors included in the first region and the signal conductors of the three or more signal conductors included in the at least one second region.

6. The multilayer board according to claim 5, wherein the at least one interlayer connection conductor is defined by a via conductor.

7. The multilayer board according to claim 6, wherein the via conductor is made of a copper-tin-based material.

8. The multilayer board according to claim 1, further comprising at least one interlayer connection conductor connecting the plurality of ground conductors in the lamination direction, in an outer edge portion of the parallel extending portion.

9. The multilayer board according to claim 4, wherein each of the three or more signal conductors is surrounded by the plurality of ground conductors and the at least one interlayer connection conductor.

10. The multilayer board according to claim 8, wherein the at least one interlayer connection conductor is defined by a via conductor.

11. The multilayer board according to claim 10, wherein the via conductor is made of a copper-tin-based material.

12. The multilayer board according to claim 1, further comprising an auxiliary ground conductor disposed along the transmission direction and connected to the plurality of ground conductors, between the signal conductors of the three or more signal conductors included in the first region and the signal conductors of the three or more signal conductors included in the at least one second region.

13. The multilayer board according to claim 1, further comprising an auxiliary ground conductor disposed along the transmission direction and connected to the plurality of ground conductors, in the outer edge portion of the parallel extending portion.

14. The multilayer board according to claim 1, wherein in the first region, the signal conductors of the three or more signal conductors provided along the lamination direction are provided at a higher density on a mounting surface side.

15. The multilayer board according to claim 1, wherein the laminated insulating body includes a resist covering one of the plurality of ground conductors.

* * * * *